United States Patent
Lee et al.

(10) Patent No.: US 10,818,802 B2
(45) Date of Patent: *Oct. 27, 2020

(54) SEMICONDUCTOR DEVICE

(71) Applicant: Samsung Electronics Co., Ltd., Suwon-si, Gyeonggi-do (KR)

(72) Inventors: Jong Ho Lee, Seoul (KR); Ho Jun Kim, Suwon-si (KR); Sung Dae Suk, Seoul (KR); Geum Jong Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,505

(22) Filed: Mar. 23, 2018

(65) Prior Publication Data

US 2018/0212067 A1  Jul. 26, 2018

Related U.S. Application Data

(63) Continuation of application No. 15/666,844, filed on Aug. 2, 2017, now Pat. No. 9,985,141, which is a (Continued)

(30) Foreign Application Priority Data

Feb. 26, 2016  (KR) ........................ 10-2016-0023387

(51) Int. Cl.
*H01L 29/786* (2006.01)
*H01L 29/06* (2006.01)
(Continued)

(52) U.S. Cl.
CPC .... *H01L 29/78696* (2013.01); *H01L 29/0665* (2013.01); *H01L 29/42376* (2013.01); *H01L 29/42392* (2013.01); *H01L 29/66545* (2013.01)

(58) Field of Classification Search
CPC ......... H01L 29/42392; H01L 29/42376; H01L 29/0665; H01L 29/78696; H01L 29/66545;
(Continued)

(56) References Cited

U.S. PATENT DOCUMENTS 7,892,945 B2  2/2011 Bedell et al.
8,709,888 B2  4/2014 Chang et al.
(Continued)

FOREIGN PATENT DOCUMENTS

CN  101226960 A  7/2008

OTHER PUBLICATIONS

Office Action dated Jan. 2, 2020, issued in corresponding Chinese Patent Application No. 20170107234.X.

*Primary Examiner* — Stephen W Smoot
*Assistant Examiner* — Vicki B. Booker
(74) *Attorney, Agent, or Firm* — Harness, Dickey & Pierce, P.L.C.

(57) ABSTRACT

A semiconductor device according to example embodiments of inventive concepts may include a substrate, source/drain regions extending perpendicular to an upper surface of the substrate, a plurality of nanosheets on the substrate and separated from each other, and a gate electrode and a gate insulating layer on the substrate. The nanosheets define channel regions that extend in a first direction between the source/drain regions. The gate electrode surrounds the nanosheets and extends in a second direction intersecting the first direction. The gate insulating layer is between the nanosheets and the gate electrode. A length of the gate electrode in the first direction may be greater than a space between adjacent nanosheets among the nanosheets.

13 Claims, 35 Drawing Sheets

Related U.S. Application Data continuation of application No. 15/222,276, filed on Jul. 28, 2016, now Pat. No. 9,825,183.

(51) Int. Cl.
  *H01L 29/423* (2006.01)
  *H01L 29/66* (2006.01)

(58) Field of Classification Search
  CPC .................. H01L 29/785; H01L 29/0673; H01L 27/0886
  See application file for complete search history.

(56) References Cited

U.S. PATENT DOCUMENTS

| | | | |
|---|---|---|---|
| 8,728,885 B1 | 5/2014 | Pham et al. | |
| 8,896,101 B2 | 11/2014 | Then et al. | |
| 8,987,794 B2 | 3/2015 | Rachmady et al. | |
| 8,994,081 B2 | 3/2015 | Leobandung | |
| 9,006,087 B2 | 4/2015 | Chang et al. | |
| 9,006,829 B2 | 4/2015 | Colinge et al. | |
| 9,431,512 B2 | 8/2016 | Koh et al. | |
| 9,472,555 B1* | 10/2016 | Balakrishnan | H01L 27/0924 |
| 9,490,340 B2 | 11/2016 | Koh et al. | |
| 2005/0167650 A1* | 8/2005 | Orlowski | H01L 29/42384 257/16 |
| 2006/0240622 A1* | 10/2006 | Lee | H01L 29/42392 438/257 |
| 2008/0029909 A1 | 2/2008 | Hijzen et al. | |
| 2008/0173936 A1 | 7/2008 | Yoon et al. | |
| 2014/0001441 A1* | 1/2014 | Kim | H01L 29/0673 257/29 |
| 2014/0151638 A1 | 6/2014 | Chang et al. | |
| 2014/0353574 A1 | 12/2014 | Li et al. | |
| 2015/0090958 A1* | 4/2015 | Yang | H01L 29/0676 257/27 |
| 2015/0243733 A1 | 8/2015 | Yang et al. | |
| 2015/0325481 A1 | 11/2015 | Radosavljevic et al. | |
| 2015/0332971 A1 | 11/2015 | Ching et al. | |
| 2016/0020305 A1* | 1/2016 | Obradovic | H01L 29/7391 257/39 |
| 2016/0204195 A1 | 7/2016 | Wen et al. | |
| 2016/0315167 A1 | 10/2016 | Nakamura et al. | |

\* cited by examiner

SEMICONDUCTOR DEVICE

CROSS-REFERENCE TO RELATED APPLICATION

This U.S. Non-Provisional patent application is a continuation of U.S. application Ser. No. 15/666,844, filed on Aug. 2, 2017, which is a continuation of U.S. application Ser. No. 15/222,276, filed on Jul. 28, 2016, which claims priority under 35 USC § 119 to Korean Patent Application No. 10-2016-0023387, filed on Feb. 26, 2016, in the Korean Intellectual Property Office, the entire contents of each of the above-referenced applications are hereby incorporated by reference.

BACKGROUND

The present disclosure relates to a semiconductor device.

Semiconductor devices are important elements in the electronic industry. Storage devices for storing data, processors for processing data and the like may be provided by semiconductor devices. Recently, a number of studies aimed at improving a degree of integration of semiconductor devices and reducing the power consumption thereof have been undertaken. In addition, various studies aimed at developing a semiconductor device having a three dimensional structure, in order to reduce limitations caused by a decrease in size of a semiconductor element included in a semiconductor device, have been carried out.

SUMMARY

The present disclosure relates to a semiconductor device that limits (and/or prevents) formation of voids between a plurality of channel regions in a fabrication process.

According to example embodiments of inventive concepts, a semiconductor device may include a substrate, source/drain regions on the substrate, a plurality of nanosheets on the substrate between the source/drain regions, a gate electrode on the substrate and surrounding the plurality of nanosheets, and a gate insulating layer on the substrate between the plurality of nanosheets and the gate electrode. The source/drain regions extend perpendicular to an upper surface of the substrate. The plurality of nanosheets are separated from each other. The plurality of nanosheets define channel regions that extended in a first direction. The gate electrode extends in a second direction that intersects the first direction. A length of the gate electrode in the first direction may be greater than a space between adjacent nanosheets among the plurality of nanosheets.

According to example embodiments of inventive concepts, a semiconductor device may include a substrate, a plurality of nanosheets on the substrate and extending in a first direction, and a gate electrode on the substrate burying the plurality of nanosheets. The gate electrode includes a first region between the plurality of nanosheets and a second region surrounding the first region. The first region and the second region have different stack structures from each other.

According to example embodiments of inventive concepts, a semiconductor device may include a substrate, source/drain regions on the substrate, a plurality of nanosheets on the substrate, a gate insulating layer on the substrate surrounding the plurality of nanosheets, and a gate electrode on the substrate and burying the plurality of nanosheets. The source/drain regions extend perpendicular to an upper surface of the substrate. The plurality of nanosheets extended a first direction over the upper surface of the substrate and connect to the source/drain regions. The plurality of nanosheets are separated from each other in the direction perpendicular to the upper surface of the substrate. The gate electrode includes a first region between the plurality of nanosheets and a second region surrounding the first region. The number of metal layers included in the first region is less than the number of metal layers included in the second region. A length of the gate electrode is greater than or equal to about 1.2 times a space between adjacent nanosheets among the plurality of nanosheets.

According to example embodiments of inventive concepts, a semiconductor device includes a pair of source/drain regions spaced apart from each other in a first direction, a plurality of nanosheets between the pair of source drain regions, a gate electrode, and a gate insulating layer. The pair of source/drain regions include sidewalls that face each other. The plurality of nanosheets are spaced apart from each other along the sidewalls of the pair of source/drain regions. The plurality of nanosheets include a semiconductor material. The gate electrode includes a first region extending between the plurality of nanosheets and a second region on an uppermost one of the plurality of nanosheets. The first region is connected to the second region. The gate insulating layer is between gate electrode and the plurality of nanosheets. The gate insulating layer extends between the gate electrode and the pair of source/drain regions.

BRIEF DESCRIPTION OF DRAWINGS

The above and other aspects and features of inventive concept will be more clearly understood from the following detailed description taken in conjunction with the accompanying drawings, in which.

DETAILED DESCRIPTION

Hereinafter, example embodiments of inventive concepts will be described as follows with reference to the attached drawings.

Figure 1:
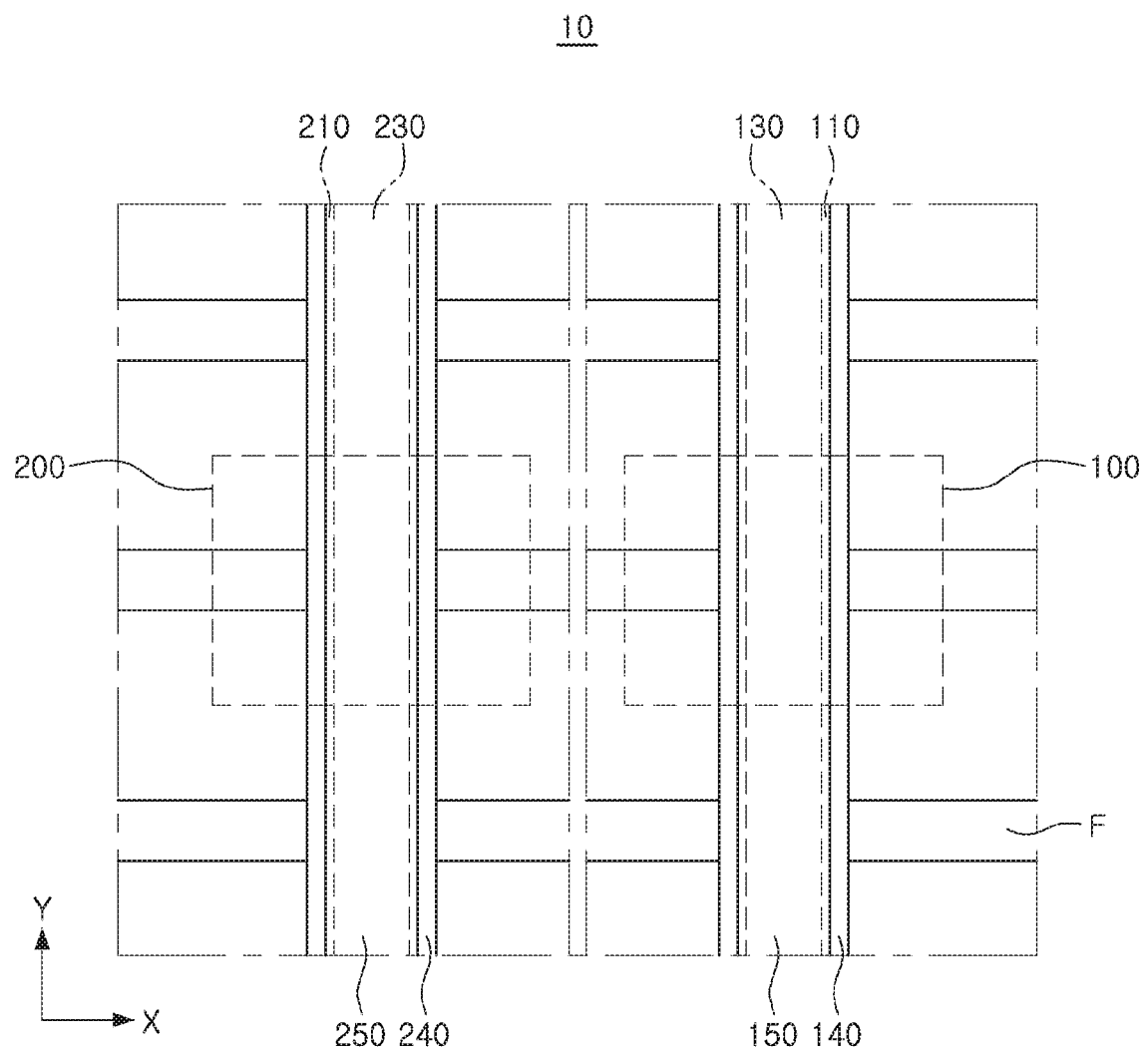
FIG. 1 is a schematic plan view of a semiconductor device according to example embodiments of inventive concepts.

FIG. 1 is a schematic plan view of a semiconductor device according to example embodiments of inventive concepts.

Referring to FIG. 1, a semiconductor device 10 according to example embodiments of inventive concepts may include a plurality of fin structures F provided as an active area and a plurality of gate electrodes 130 formed to intersect the fin structures F. The plurality of fin structures F may be formed in a direction perpendicular to an upper surface (X-Y plane in FIG. 1) of a substrate. The substrate may include a semiconductor material. The plurality of fin structures F may include source/drain regions doped with impurities, and a channel region may be formed between the source/drain regions.

The channel region may be buried in the gate electrode 130. For example, the gate electrode 130 may be formed to surround the channel region and to intersect the plurality of fin structures F. The channel region may be provided by a nanosheet disposed between the source/drain regions. In example embodiments, the nanosheet may have a thickness in the range of several to several tens of nanometers (e.g., 2 nm to 100 nm).

The gate electrode 130 may be formed of a conductive material, such as metal, metal silicide, polysilicon, or the like, and combinations thereof. The gate electrode 130 may include a plurality of layers. When the gate electrode 130 includes the plurality of layers, the gate electrode 130 may include a work function metal layer, a barrier metal layer, a gate metal layer and the like. In example embodiments, a protection layer 150, which limits (and/or prevents) oxygen from permeating into the gate electrode 130, may be provided on an upper portion of the gate electrode 130.

A gate insulating layer 110 and a spacer 140 may be disposed on sides of the gate electrode 130. In a similar manner to the gate electrode 130, the gate insulating layer 110 and the spacer 140 may be formed to surround the channel region CH and to intersect the plurality of fin structures F. The gate electrode 130 may extend in one direction (e.g., direction of a Y-axis in FIG. 1) while being in contact with the fin structure F.

The gate insulating layer 110 may include a plurality of layers. In example embodiments, the gate insulating layer 110 may include a first insulating layer 111 and a second insulating layer 112. The first and second insulating layers 111 and 112 may have different permittivities. For example, when the first insulating layer 111 is disposed closer to the channel region CH than the second insulating layer 112 disposed thereto, the first insulating layer 111 may have a lower permittivity than that of the second insulating layer 112.

Figure 2:
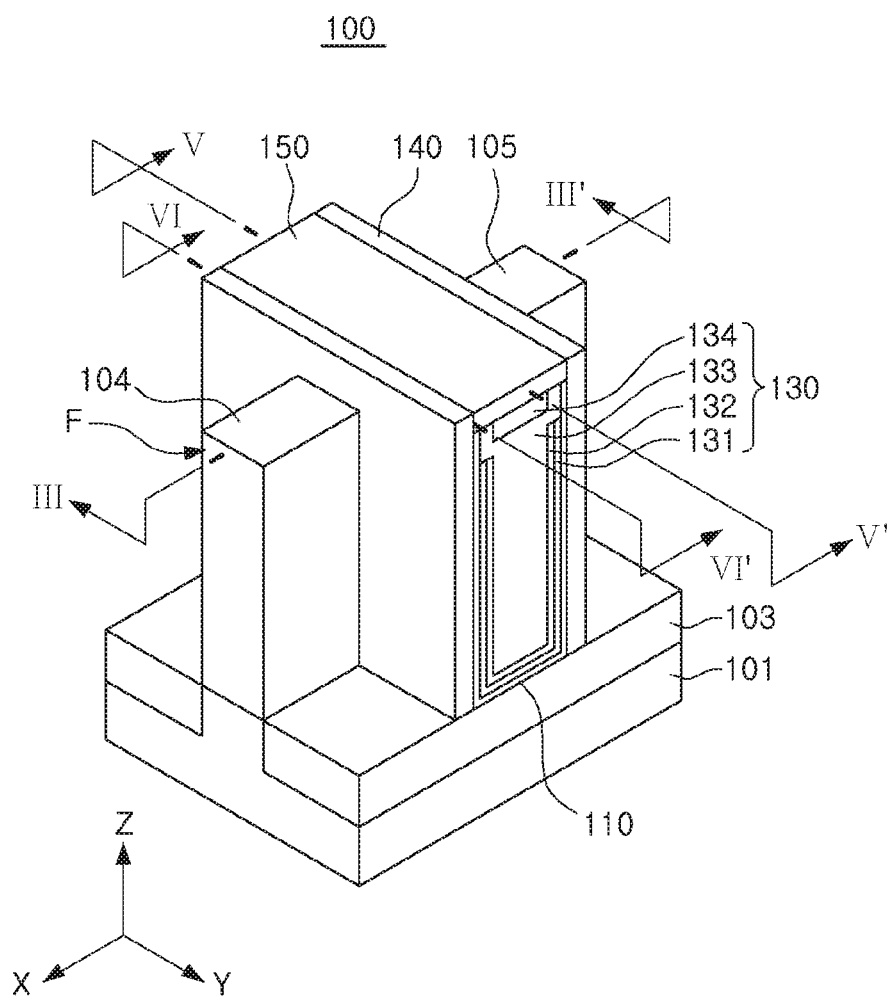
FIG. 2 is a perspective view of a portion of a semiconductor device according to example embodiments of inventive concepts.

FIG. 2 is a perspective view of a portion of a semiconductor device according to example embodiments of inventive concepts.

Referring to FIG. 2, a semiconductor device 100 according to example embodiments may include a substrate 101, source/drain regions 104 and 105 formed on the substrate 101, and a gate electrode 130 formed to intersect source/drain regions 104 and 105. The gate electrode 130 may be formed to surround a channel region disposed between the source/drain regions 104 and 105. In addition, a gate insulating layer 110 and a spacer 140 may be disposed on sides of the gate electrode 130. The gate insulating layer 110 may be also disposed between the gate electrode 130 and the channel region CH.

The channel regions may be provided by a plurality of nanosheets. The plurality of nanosheets may be disposed between the source/drain regions 104 and 105. The plurality of nanosheets may be separated from each other in a direction (direction of a Z-axis in FIG. 2) perpendicular to an upper surface of the substrate 101. Spaces between the plurality of nanosheets may be filled with the gate electrode 130.

A substrate insulating layer 103 may be provided on the substrate 101, and disposed to surround a portion of the substrate 101. In example embodiments, a portion of the substrate 101 may protrude upwardly to be connected to the source/drain regions 104 and 105. The substrate insulating layer 103 may be disposed to surround sides of the protruding portion of the substrate 101. An upper surface of the substrate insulating layer 103 may be coplanar with that of the substrate 101. In addition, an interlayer insulating layer may be disposed on the substrate insulating layer 103 to cover the gate electrode 130 and the source/drain regions 104 and 105.

Figure 3:
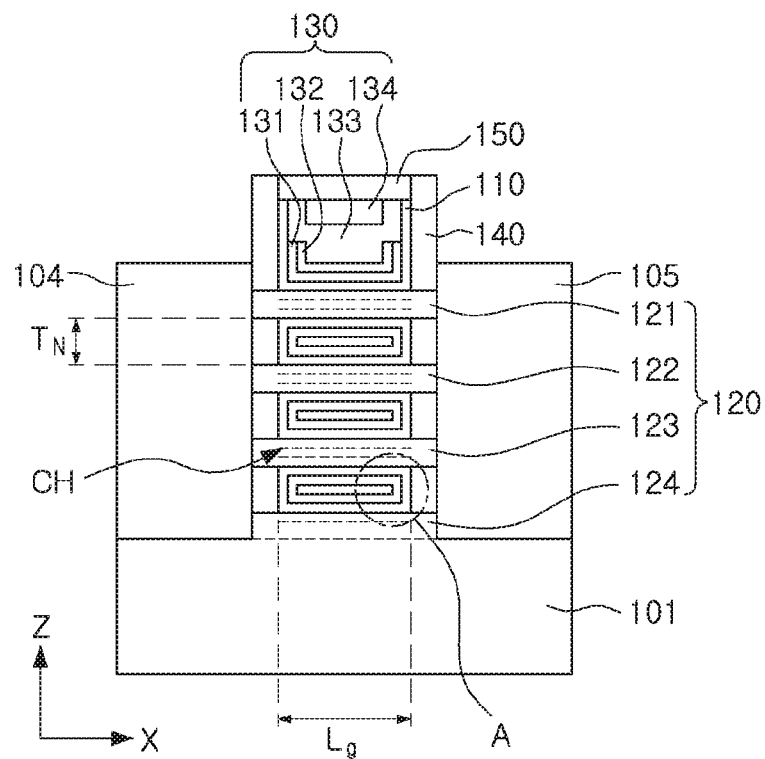
FIG. 3 is a cross-sectional view taken along line III-III' of the semiconductor device illustrated in FIG. 2.
Figure 4:
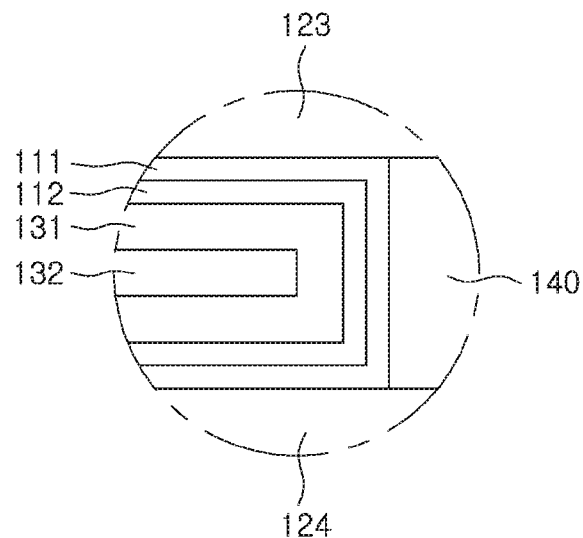
FIG. 4 is an enlarged view of region A of the semiconductor device illustrated in FIG. 3.

FIG. 3 is a cross-sectional view taken along line of the semiconductor device illustrated in FIG. 2. FIG. 4 is an enlarged view of region A of the semiconductor device illustrated in FIG. 3.

Referring to FIG. 3, the semiconductor device 100 may include a plurality of nanosheets 121 to 124 (nanosheets 120) separated from each other along one direction (direction of a Z-axis in FIG. 3) on the substrate 101, the source/drain regions 104 and 105 connected to each other by the nanosheets 120, the gate electrode 130 and the like. The gate electrode 130 may be formed to bury the plurality of nanosheets 120. The gate insulating layer 110 may be disposed between the gate electrode 130 and the plurality of nanosheets 120. The number and a disposition of the nanosheets 120 are not limited to the configuration of FIG. 3, and may be variously changed.

The plurality of nanosheets 120 may provide the channel regions CH. The channel regions CH may be provided by portions of the nanosheets 120 adjacent to the gate insulating layer 110 and the gate electrode 130. When a voltage more than threshold voltage of the semiconductor device 100 is applied to the gate electrode 130, a depletion region may be formed on the channel regions CH to flow a current between the source/drain regions 104 and 105. The threshold voltage may be determined by a material contained in the gate electrode 130 and a stack structure of the gate electrode 130.

In example embodiments, the gate electrode 130 may include the work function metal layer 132 and 133, and the gate metal layer 134. The barrier metal layer 131 may be further provided between the work function metal layer 132 and 133, and the gate insulating layer 110. The barrier metal layer 131 may be formed of tantalum nitride (TaN), tantalum nitride oxide (TaNO), tantalum silicon nitride (TaSiN), titanium silicon nitride (TiSiN) and the like. The stack structure of the gate electrode 130 is not limited to the configuration of FIG. 3, and may be variously changed.

The work function metal layer 132 and 133 may determine a threshold voltage of the semiconductor device 100. In example embodiments, the work function metal layer 132 and 133 may include a first work function metal layer 132 and a second work function metal layer 133 stacked on each other. The first and second work function metal layers 132 and 133 may include different materials from each other. A material of the work function metal layer 132 and 133 may vary depending on whether the semiconductor device 100 is an n-type semiconductor device or a p-type semiconductor device. When the semiconductor device 100 is the n-type semiconductor device, the work function metal layer 132 and 133 may include hafnium, zirconium, titanium, tantalum, aluminum and metal carbide including the above-described metal. When the semiconductor device 100 is the p-type semiconductor device, the work function metal layer 132 and 133 may include ruthenium, palladium, platinum, cobalt, nickel and oxides thereof. However, the materials of the work function metal layer 132 and 133 may be variously modified in addition to the above materials.

The gate metal layer 134 may be filled a space defined on the work function metal layer 132 and 133. An upper surface of the gate metal layer 134 may be coplanar with that of the second work function metal layer 133. The gate metal layer 134 may be formed of titanium nitride (TiN).

Referring to FIG. 3, in the semiconductor device 100 according to example embodiments, a gate length Lg may be greater than a spacing $T_N$ between adjacent ones of the nanosheets 120. The gate length Lg may be defined as a length of the gate electrode 130 or a spacing between the spacers in a first direction (direction of an X-axis in FIG. 3). In example embodiments, a gate length Lg may be greater than or equal to about 1.2 times the spacing $T_N$ between the nanosheets 120. A thickness (thickness of the Z-axis direction) of the nanosheet 120 may be less than or equal to about 50 nm, and the length (length of the X-axis direction) of the nanosheet 120 may be several tens of nanometers (e.g., 2 nm to 100 nm). The nanosheet 120 may have the length greater than the thickness thereof. The nanosheet 120 may also have the thickness less than or equal to the spacing $T_N$ therebetween. In example embodiments, the spacing $T_N$ between the nanosheets 120 may be greater than 0 nm and less than or equal to about 30 nm.

When the thickness of the nanosheet 120 is less than or equal to about 0.8 times the spacing $T_N$ between the nanosheets 120, a space between the nanosheets 120 may be filled with the gate insulating layer 110 and the gate electrode 130 without lowering a degree of integration of the semiconductor device 100. In addition, a sum of the spacing $T_N$ between adjacent ones of the nanosheets 120 and the thickness of the nanosheet 120 may be substantially the same as the gate length Lg of the gate electrode 130.

A thickness of the spacer 140 (thickness of the X-axis direction) may be around 10 nm (e.g., in a range of about 5 nm to about 15 nm), and the gate length Lg of the gate electrode 130 may be determined by subtracting twice the thickness of the spacer 140 from the length of the nanosheet 120. As previously described, the gate length Lg of the gate electrode 130 may be determined to a value greater than or equal to about 1.2 times the spacing $T_N$ between the nanosheets 120. Accordingly, in example embodiments, a thickness of the spacer 140, a length of the nanosheet 120 and a spacing $T_N$ between the nanosheets 120 may be determined according to conditions such as Equation 1 below.

$$1.2 * T_N \leq (a \text{ length of } a \text{ nanosheet} - 2 * a \text{ thickness of } a \text{ spacer})$$ [Equation 1]

In order to limit (and/or prevent) a space between the nanosheets 120 from being incompletely filled with the gate electrode 130, the gate electrode 130 may be formed to have the gate length Lg greater than the spacing $T_N$ between the nanosheets 120. The gate electrode 130 may be formed by removing a dummy gate provided between the spacers 140 and then filling a space from which the dummy gate has been removed, with a metal material. Before filling the space with the metal material, the gate insulating layer may be formed first on an inner side of the spacer 140 and an outer side of the nanosheet 120. In this case, if the space between the spacers 140 is first filled with the metal material before filling the space between the nanosheets 120, the space between the nanosheet 120 may be incompletely filled with the metal material. Accordingly, voids may be generated from the incompletely filled space. Accordingly, a performance of the semiconductor device 100 may be deteriorated due to the void in the space between nanosheets 120.

Accordingly, in order to limit and/or prevent a void in the space between the nanosheets, the gate electrode 130 may be formed so as to have the larger length Lg than the spacing $T_N$ between the nanosheets 120. In addition, the gate length Lg may correspond to the spacing between the spacers 140. Accordingly, by securing a sufficient space between the spacers 140, the space between the nanosheets 120 may be first filled with the gate electrode 130 before filling the space between the spacers 140 with the gate electrode 130.

Referring to FIG. 4, the gate insulating layer 110 may include a plurality layers. In example embodiments, the gate insulating layer 110 may include a first insulating layer and a second insulating layer. The first and second insulating layers 111 and 112 may have different permittivities from each other. The permittivity of the second insulating layer may be greater than that of the first insulating layer. In this case, the second insulating layer may be disposed closer to the gate electrode 130 than the first insulating layer disposed thereto. In other words, the first insulating layer may be disposed closer to the channel region CH than the second insulating layer disposed thereto. By disposing the first insulating layer having a relatively low level of permittivity to be closer to the channel region CH than the second insulating layer having a relatively high level of permittivity, characteristics of the memory device such as erase characteristics may be improved. Meanwhile, the second insulating layer having a relatively high level of permittivity may be thicker than the first insulating layer.

The second insulating layer 112 having a relatively high level of permittivity may include silicon oxide ($SiO_2$), silicon nitride ($Si_3N_4$), silicon oxynitride (SiON), or a high dielectric constant material. A high dielectric constant material may be a material, such as aluminium oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminium oxide ($LaAl_xO_y$), lanthanum hafnium oxide ($LaHf_xO_y$), hafnium aluminium oxide ($HfAl_xO_y$), and praseodymium oxide ($Pr_2O_3$).

In addition, only the barrier metal layer 131 and the work function metal layer 132 and 133 among the plurality of metal layers 131 to 134 may be disposed between adjacent ones of the nanosheets 120. In FIG. 4, a space between adjacent ones of nanosheets may be filled with the barrier metal layer 131 and the first work function metal layer 132 only. The number of metal layers 131 to 134 disposed between the nanosheets 120 may be determined by the spacing $T_N$ between the nanosheets 120 and each thickness of metal layers 131 to 134.

Figure 5:
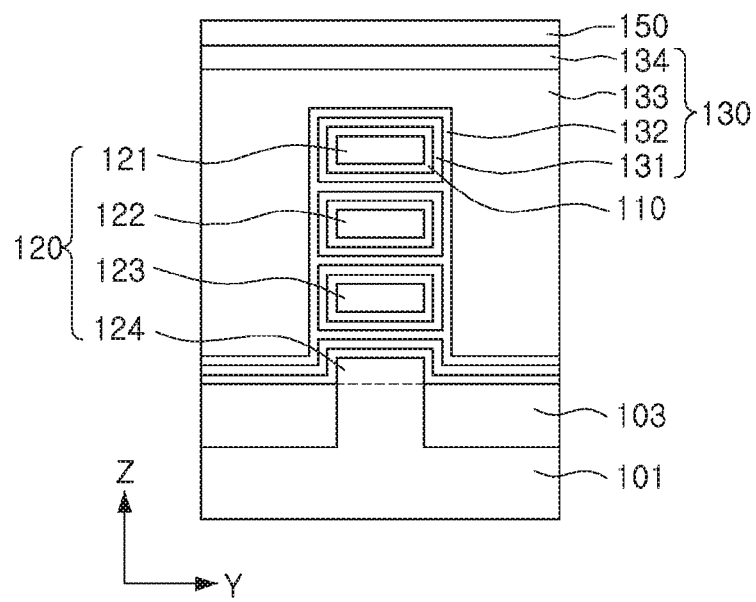
FIG. 5 is a cross-sectional view taken along line V-V' of the semiconductor device illustrated in FIG. 2.

FIG. 5 is a cross-sectional view taken along line V-V' of the semiconductor device illustrated in FIG. 2.

Referring to FIG. 5, the plurality of nanosheets 120 may be disposed on the substrate 101. The plurality of nanosheets 120 may include first to fourth nanosheets 121 to 124. The fourth nanosheet 124 may be on an upper surface of the substrate 101, and the first to third nanosheets 121 to 123 may be separated from the substrate 101. The first to fourth nanosheets 121 to 124 may be separated from each other to dispose the gate insulating layer 110 and a portion of the gate electrode 130 each between adjacent ones of the nanosheets 120. In other words, at least a portion of the first to fourth nanosheets 121 to 124 may be buried by the gate electrode 130.

The gate electrode 130 may include the barrier metal layer 131, the work function metal layer 132 and 133, and the gate metal layer 134. The plurality of metal layers 131 to 134 included in the gate electrode 130 may be sequentially stacked on each of the nanosheets 120. In FIG. 5, a space between adjacent ones of the nanosheets 120 may be filled with the barrier metal layer 131 and the first work function metal layer 132 only.

In other words, when the gate electrode 130 is divided into a first region disposed between adjacent ones of the nanosheets 120 and a second region other than the first region, the first region may not include the second work function metal layer 133 and the gate metal layer 134. According, the first region disposed between adjacent ones of the nanosheets 120 may have a different stack structure from that of the second region. In example embodiments, the number of metal layers included in the first region may be less than the number of metal layers included in the second region. Meanwhile, the second region may be defined as a region which surrounds the first region.

Figure 6:
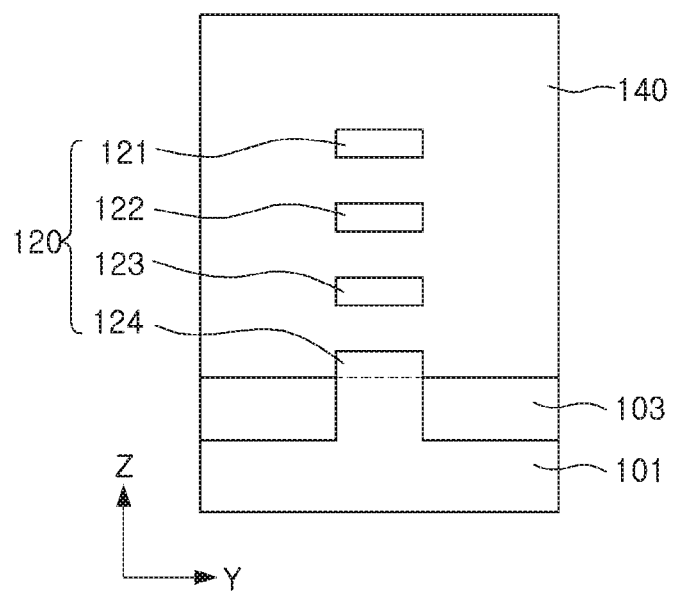
FIG. 6 is a cross-sectional view taken along line VI-VI' of the semiconductor device illustrated in FIG. 2.

FIG. 6 is a cross-sectional view taken along line VI-VI' of the semiconductor device illustrated in FIG. 2.

Referring to FIG. 6, in a cross-section taken along line VI-VI', the gate electrode 130 is not illustrated, and a structure of the plurality of nanosheets 120 surrounded by the spacers 140 may be illustrated. In example embodiments, the first to third nanosheets 121 to 123 may be surrounded by the spacers 140 in Y-axis and Z-axis directions.

At least portions of the plurality of nanosheets 120 may pass through the spacers 140 to be connected the source/drain regions 104 and 105. Referring to FIG. 3 along with FIG. 6, both sides of each of the first to third nanosheets 121 to 123 may be connected to the source/drain regions 104 and 105, may be surrounded by the gate electrode 130 and the spacers 140.

Figure 7:
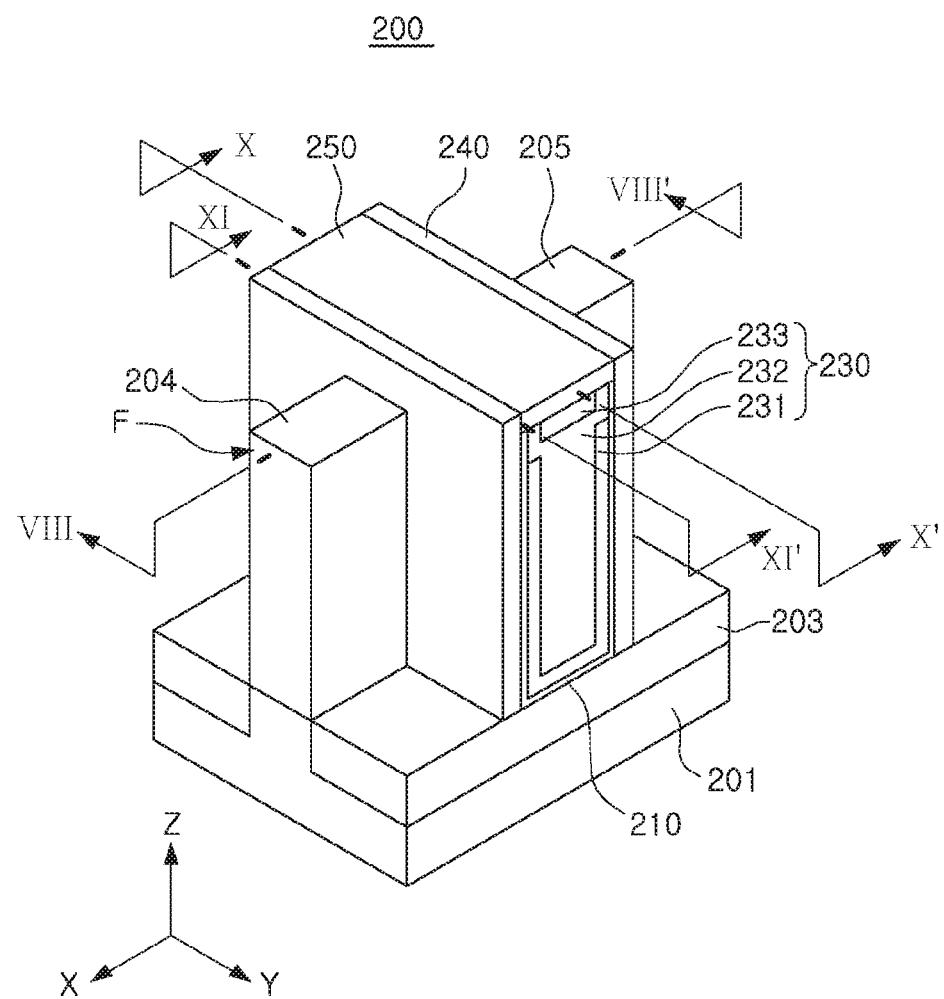
FIG. 7 is a perspective view of a portion of a semiconductor device according to example embodiments of inventive concepts.

FIG. 7 is a perspective view of a portion of a semiconductor device according to example embodiments of inventive concepts.

Referring to FIG. 7, according to example embodiments of inventive concepts, a semiconductor device 200 may include a substrate 201, source/drain regions 204 and 205 formed on the substrate 201, a gate electrode 230 formed to intersect the source/drain regions 204 and 205, and the like. In a similar manner to that of the semiconductor device 100 in FIG. 2, a gate insulating layer 210 and spacers 240 may be formed on sides of the gate electrode 230, and a portion of the substrate 201 may protrude upwardly to be connected the source/drain regions 204 and 205. The protruding portion of the substrate 201 may be surrounded by a substrate insulating layer 203.

In the semiconductor device 200 in FIG. 7, the gate electrode 230 may include a work function metal layer 231 and 232 and a gate metal layer 233. In the semiconductor device 100 in FIG. 2, the barrier metal layer 131 may be included in the gate electrode 130, while a barrier metal layer may not present in the semiconductor device 200 in FIG. 7. Accordingly, a thickness of the work function metal layer 231 and 232 may be different from that a thickness of the work function metal layer of the example embodiment illustrated in FIG. 2. Due to a difference in physical properties of the gate electrodes, each of the semiconductor devices 100 and 200 illustrated in FIGS. 2 and 7 may have different threshold voltages from each other.

Figure 8:
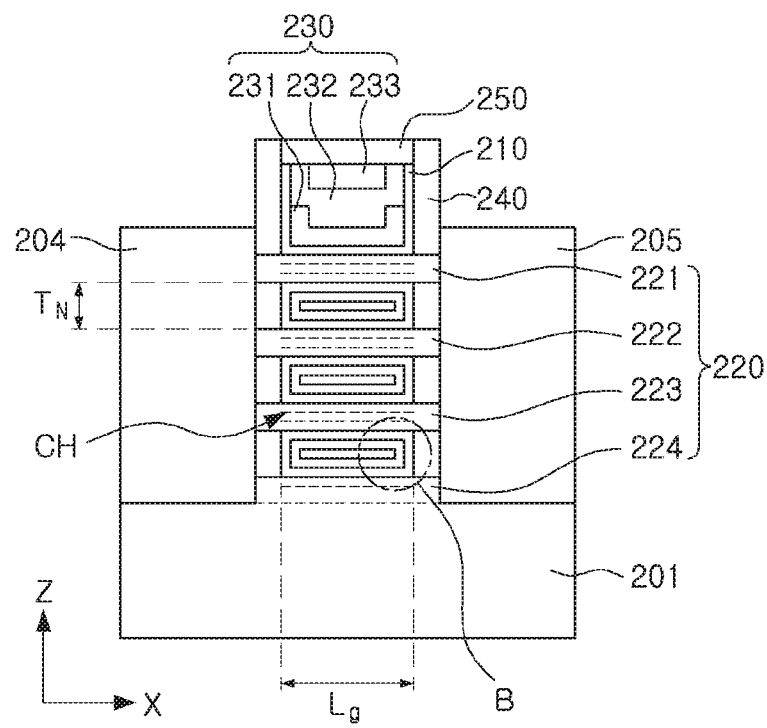
FIG. 8 is a cross-sectional view taken along line VIII-VIII' of the semiconductor device illustrated in FIG. 7.
Figure 9:
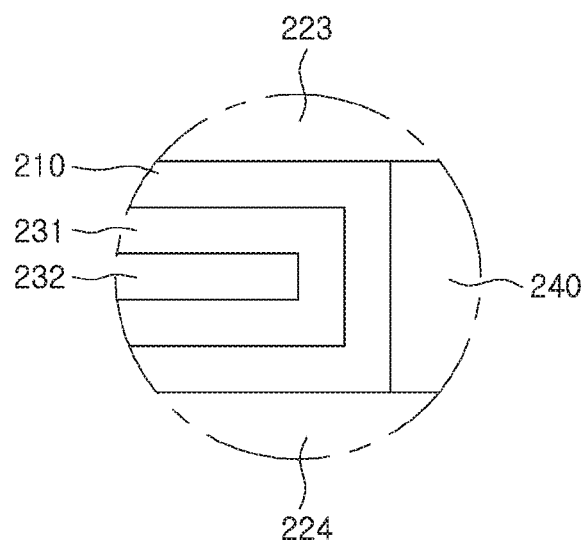
FIG. 9 is an enlarged view of region B of the semiconductor device illustrated in FIG. 8.

FIG. 8 is a cross-sectional view taken along line VIII-VIII' of the semiconductor device illustrated in FIG. 7. FIG. 9 is an enlarged view of region B of the semiconductor device illustrated in FIG. 8.

Referring to FIG. 8, in the semiconductor device 200 according to example embodiments of inventive concepts, a spacing $T_N$ between adjacent ones of a plurality of nanosheets 220 may be smaller than a gate length Lg of the gate electrode 230.

As described with reference to FIG. 3, the gate length Lg may be defined as a length of the gate electrode 230 in one direction (direction of an X-axis in FIG. 8), and may correspond to a spacing between the spacers 240. By defining the relationship between the gate length Lg and the spacing $T_N$ between the nanosheets 220, as described above, it may be limited (and/or prevented) from incompletely filling the space between the nanosheets with the gate electrode 230.

Referring to FIG. 9, agate insulating layer 210 may include a first insulating layer 211 and a second insulating layer 212. As described with reference to FIG. 4, the first and second insulating layers 211 and 212 may have different permittivities from each other. The permittivity of the second insulating layer 212 may be greater than that of the first insulating layer 211.

In addition, a space between adjacent ones of the nanosheets 220 may be filled with the gate insulating layer 210 and the first work function metal layer 231 only. The spacing $T_N$ between adjacent ones of the nanosheets 210 may be smaller than about 2 times a sum of thickness of the gate insulating layer 210 and thickness of the first work function metal layer 231.

Figure 10:
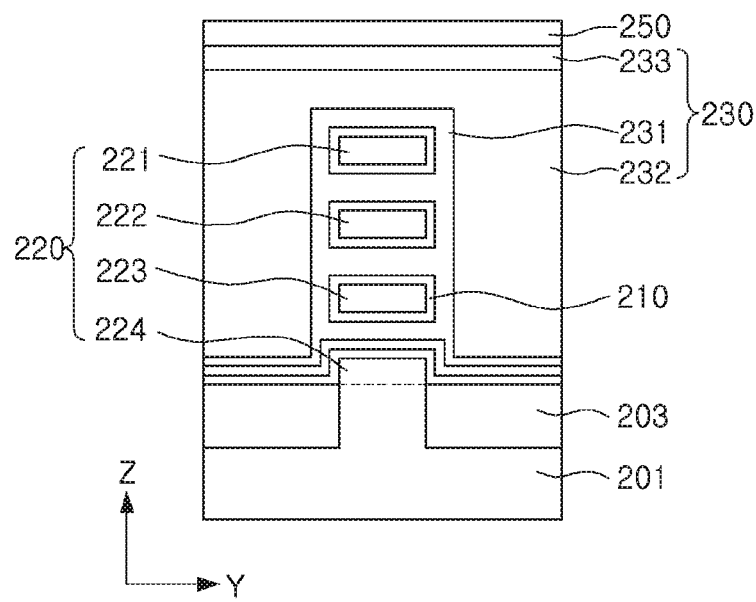
FIG. 10 is a cross-sectional view taken along line X-X' of the semiconductor device illustrated in FIG. 7.
Figure 11:
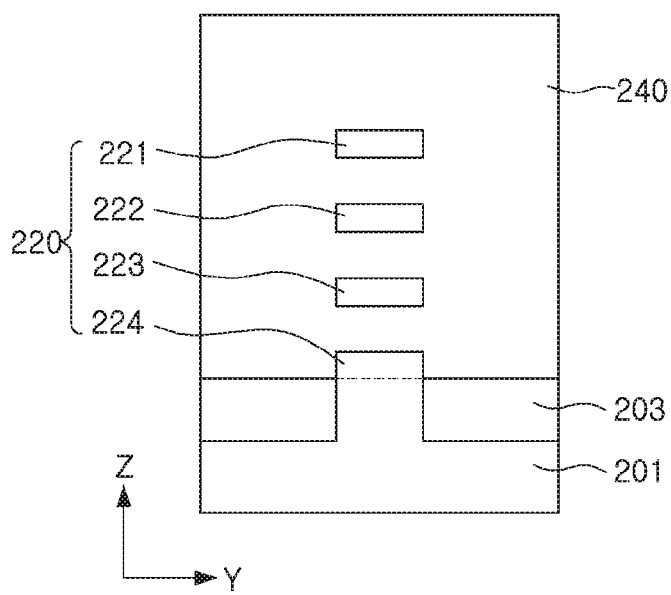
FIG. 11 is a cross-sectional view taken along line XI-XI' of the semiconductor device illustrated in FIG. 7.

FIG. 10 is a cross-sectional view taken along line X-X' of the semiconductor device illustrated in FIG. 7. FIG. 11 is a cross-sectional view taken along line XI-XI' of the semiconductor device illustrated in FIG. 7.

Referring to FIG. 10, the plurality of nanosheets 220 may be surrounded by the gate insulating layer 210 and the gate electrode 230. The gate electrode 230 may include the work function metal layer 231 and 232, and the gate metal layer 233. The work function metal layer 231 and 232 may include the first and second work function metal layers 231 and 232, and the first and second work function metal layers 231 and 232 may have different metal materials from each other.

Referring to FIG. 11, the plurality of the nanosheets 220 may be surrounded by the gate electrode 230 and the spacers 240 disposed between the source/drain regions 204 and 205. At least portions of the plurality of the nanosheets 220 may pass through the spacers 240 to be respectively connected to the source/drain regions 204 and 205.

In FIGS. 8 to 10, the space defined between the plurality of nanosheets 220 may be filled with the gate insulating layer 210 and the first work function metal layer 231. In other words, the gate insulating layer 210 and the first work function metal layer 231 may be disposed between adjacent ones of the plurality of nanosheets 220. The gate electrode 230 may be divided into a first region disposed between adjacent ones of the nanosheets 220 and a second region other than the first region. The gate electrode 230 may include different stack structures according to the first region and the second region. In the first region, the gate electrode 230 may be a stack structure including only the first work function metal layer 231. In the second region, the gate electrode 230 may be a stack structure including the first and second work function metal layer 231 and 232, and the gate metal layer 233.

Figure 43:
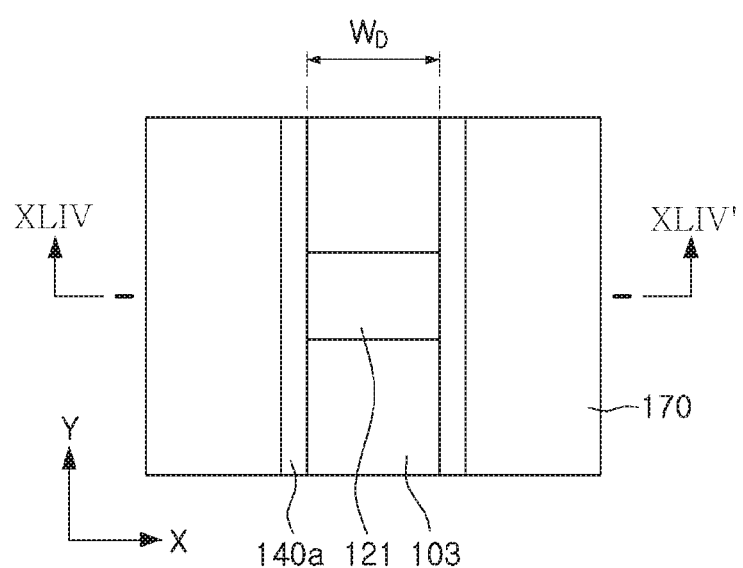
Figure 44:
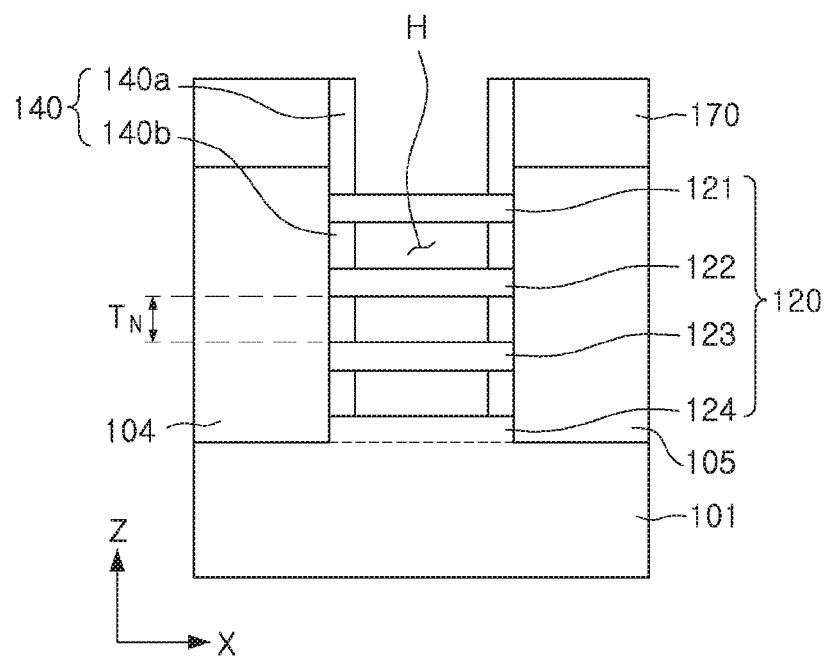

FIGS. 12 to 53 are drawings illustrating a method for fabricating the semiconductor device illustrated in FIG. 2. FIG. 14 is a cross-sectional view taken along lines XIV-XIV' of FIG. 13. FIGS. 17 and 18 are cross-sectional views taken along lines XVII-XVII' and XVII-XVIII' of FIG. 16. FIGS. 21 to 23 are cross-sectional views taken along lines XXI-XXI', XXII-XXII' and XXIII-XXIII' of FIG. 20. FIG. 26 is a cross-sectional view taken along line XXVI-XXVI' of FIG. 25. FIG. 29 is a cross-sectional view taken along line XXIX-XXIX' of FIG. 28. FIG. 32 is a cross-sectional view taken along line XXXII-XXXII' of FIG. 31. FIG. 35 is a cross-sectional view taken along line XXXV-XXXV' of FIG. 34. FIG. 38 is a cross-sectional view taken along line XXXVIII-XXXVIII' of FIG. 37. FIG. 41 is a cross-sectional view taken along line XLI-XLI' of FIG. 41. FIG. 44 is a cross-sectional view taken along line XLIV-XLIV' of FIG. 43. FIG. 47 is a cross-sectional view taken along line XLVII-XLVII' of FIG. 46. FIG. 50 is a cross-sectional view taken along line L-L' of FIG. 49. FIG. 53 is a cross-sectional view taken along line LIII-LIII' of FIG. 52.

Figure 12:
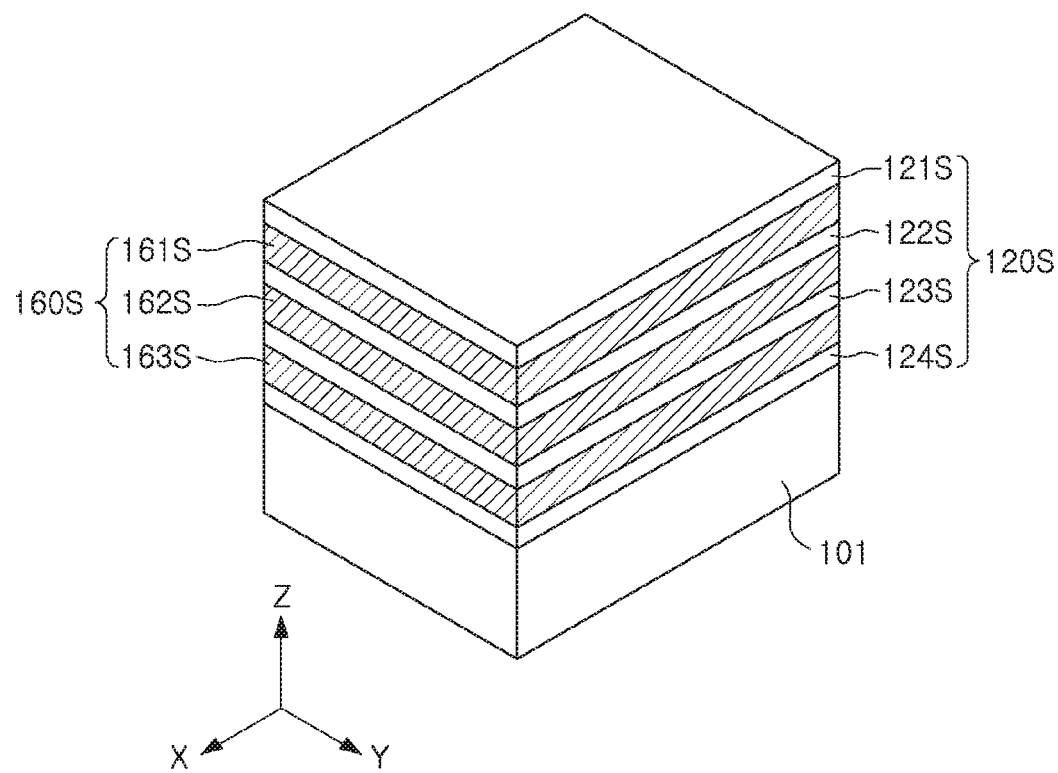
FIGS. 12 to 53 are drawings illustrating a method for fabricating the semiconductor device illustrated in FIG. 2.
Figure 13:
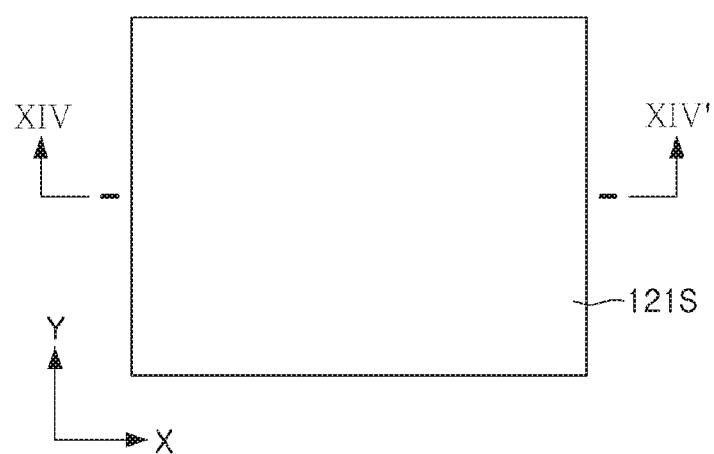
Figure 14:
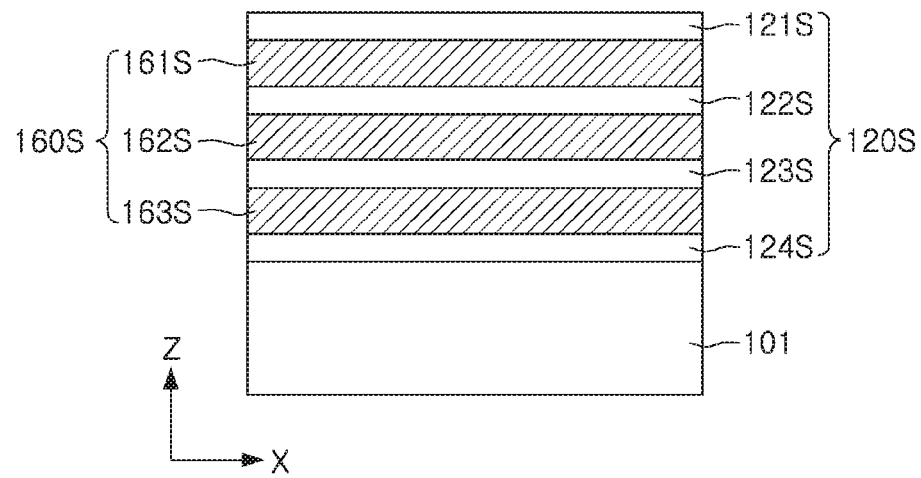
Figure 15:
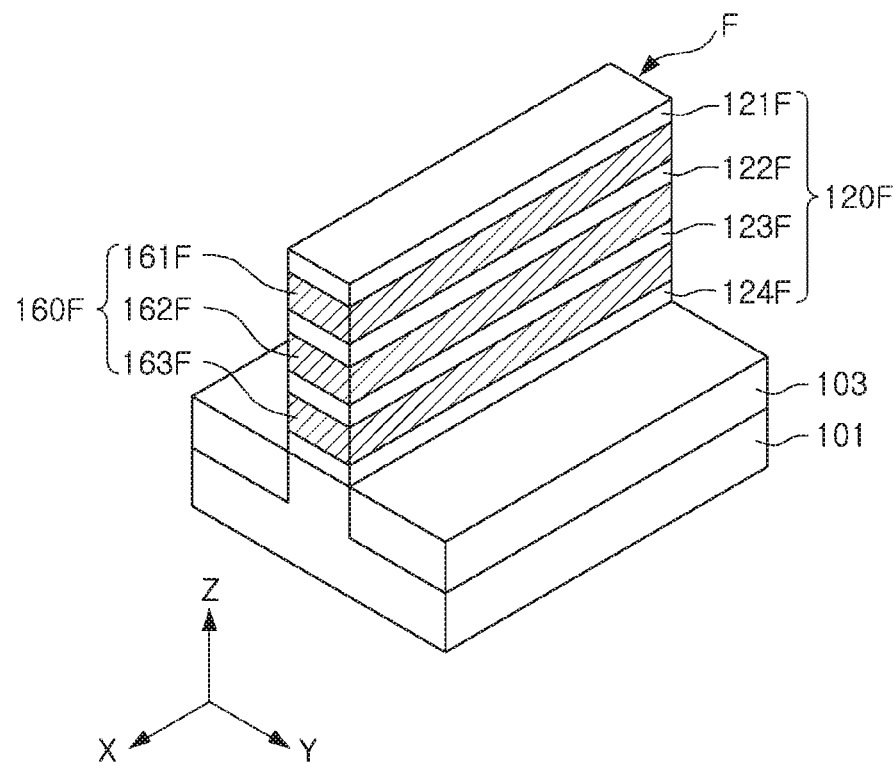

Referring to FIGS. 12 to 14, a plurality of semiconductor layers 121S to 124S (semiconductor layers 120S) and a plurality of sacrificial layers 161S to 163S (sacrificial layers 160S) may be alternately stacked on a substrate 101. FIG. 13 illustrates a top plan view of the perspective view shown in FIG. 12 as it may be viewed through the X-Y plane. The plurality of semiconductor layers 120S may include a semiconductor material, and the plurality of sacrificial layers 160S may include a material having a etch selectivity with respect to the plurality of semiconductor layers 120S. In example embodiments, the plurality of semiconductor layers 120S may include silicon (Si), and the plurality of sacrificial layers 160S may include silicon germanium (Site).

Respective thicknesses of the plurality of semiconductor layers 120S and sacrificial layers 160S may be variously changed according to example embodiments. In example embodiments, thicknesses of plurality of semiconductor layers 120S may be less than those of the plurality of sacrificial layers 160S. The plurality of sacrificial layers 160S may be removed in subsequent process, and replaced with a gate insulating layer 110 and a gate electrode 130. Accordingly, thicknesses of the plurality of sacrificial layers 160S may be substantially equal to spacing distances between the plurality of nanosheets 120, respectively.

Figure 16:
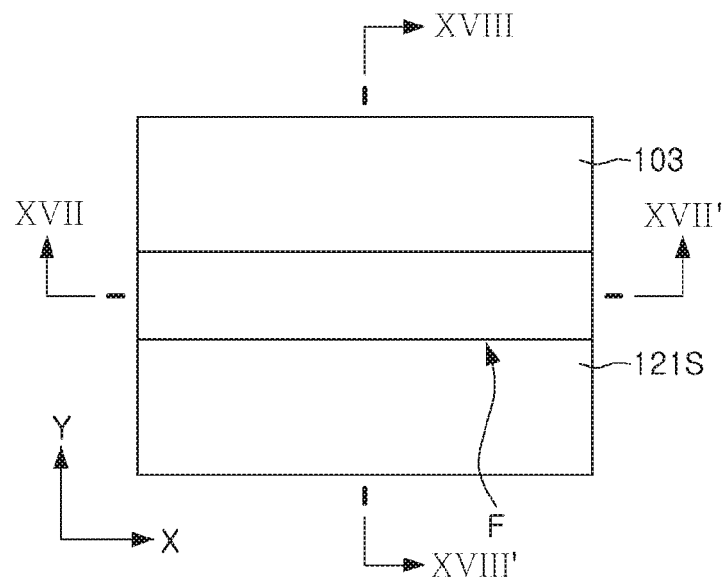
Figure 17:
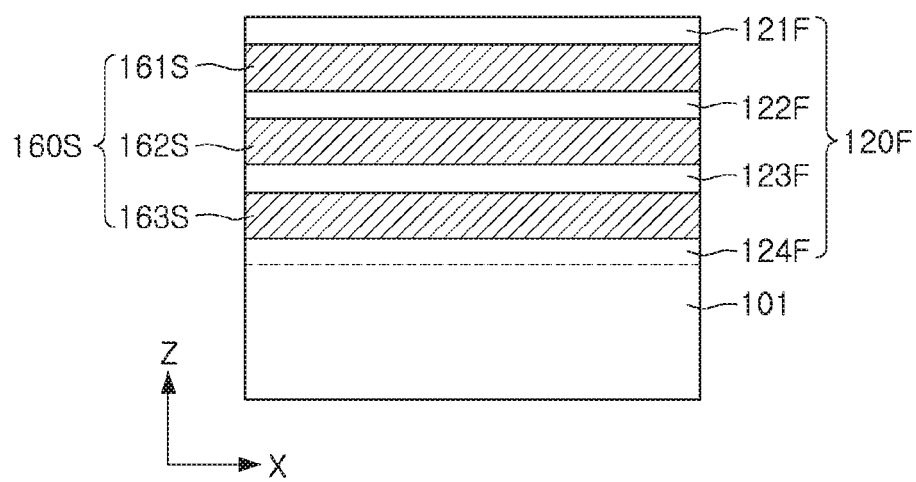
Figure 18:
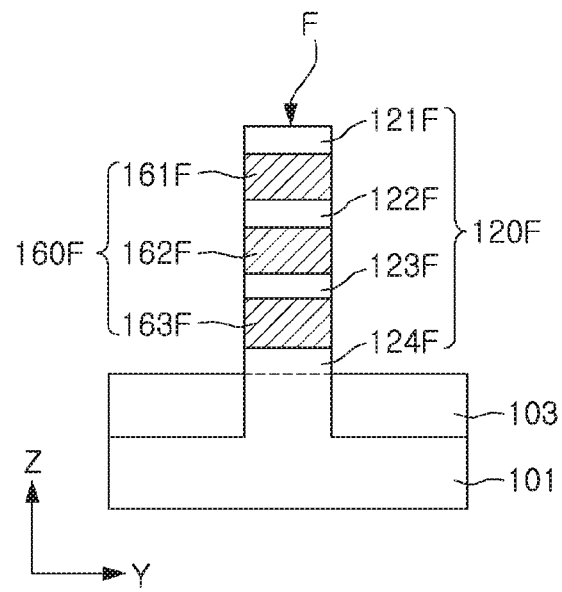
Figure 19:
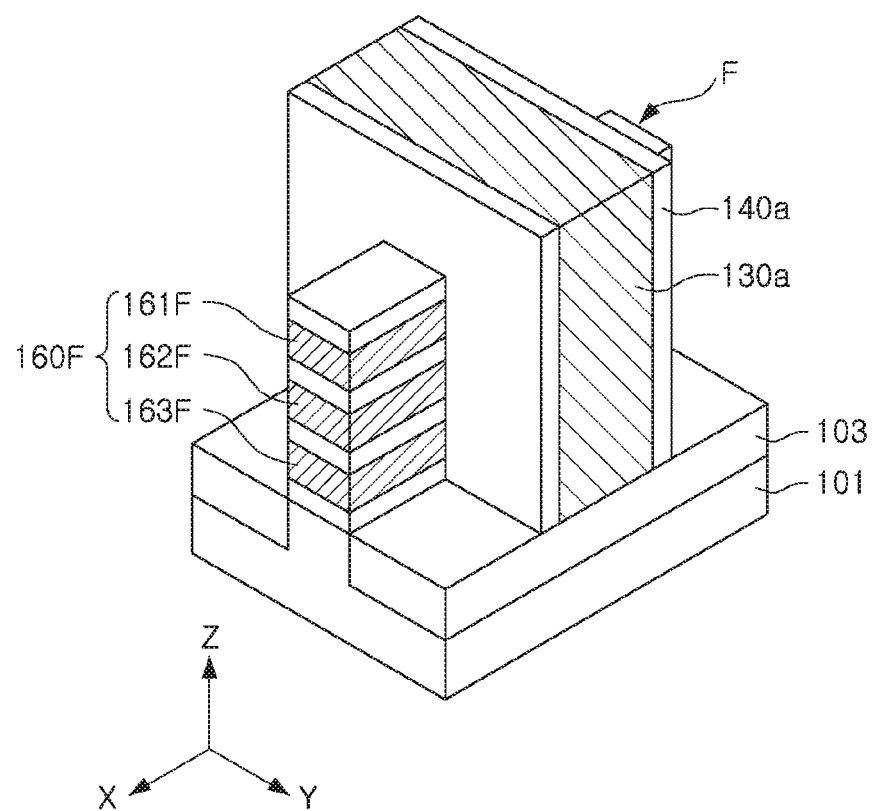

Referring to FIGS. 15 to 18, a fin structure F may be formed by removing portions of the plurality of semiconductor layers 120S and sacrificial layers 160S. FIG. 16 illustrates a top plan view of the perspective view shown in FIG. 15 as it may be viewed through the X-Y plane. Referring to FIGS. 15 to 18 together, the fin structure F may include the plurality of semiconductor layers 121F to 124F (semiconductor layers 120F) and sacrificial layers 161F to 163F (sacrificial layers 160F) alternatively stacked on the substrate 101.

In order to form the fin structure F, at least a portion of the substrate 101 may be removed from an upper surface thereof, and the substrate insulating layer 103 may be disposed therein. In this case, an upper surface of the substrate insulating layer 103 may be coplanar with the uppermost surface of the substrate 101.

As illustrated in FIG. 1, the fin structure F may extend on the substrate 101 in a specific direction, for example, in a direction of the X-axis of FIG. 1. The fin structures F may be disposed at desired (and/or alternatively predetermined) intervals therebetween. In example embodiments, a respective width of and an interval between the fin structures F in a direction of the Y-axis may be several tens of nanometers (e.g., 20 nm to 100 nm). A thickness of each of the plurality of semiconductor layers 120F may be in the range of three to thirty of nanometers. A thickness of each of the plurality of sacrificial layers 160F may be greater than that of each of the plurality of semiconductor layers 120F.

Figure 20:
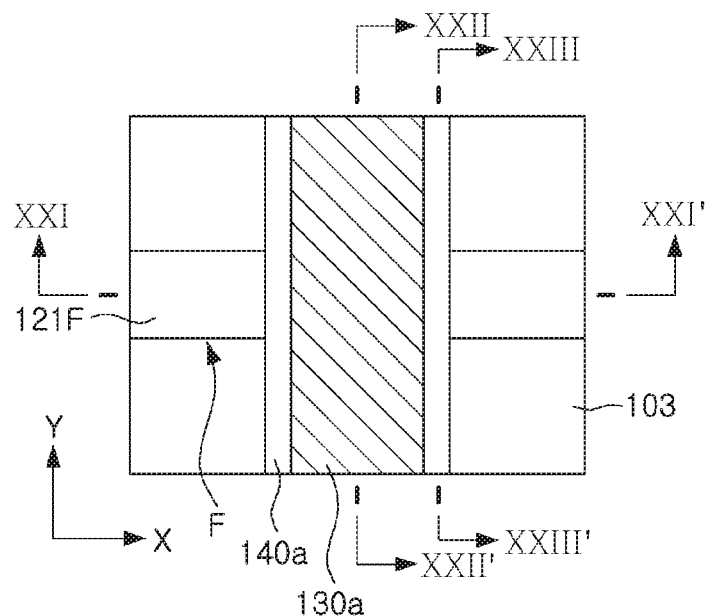
Figure 21:
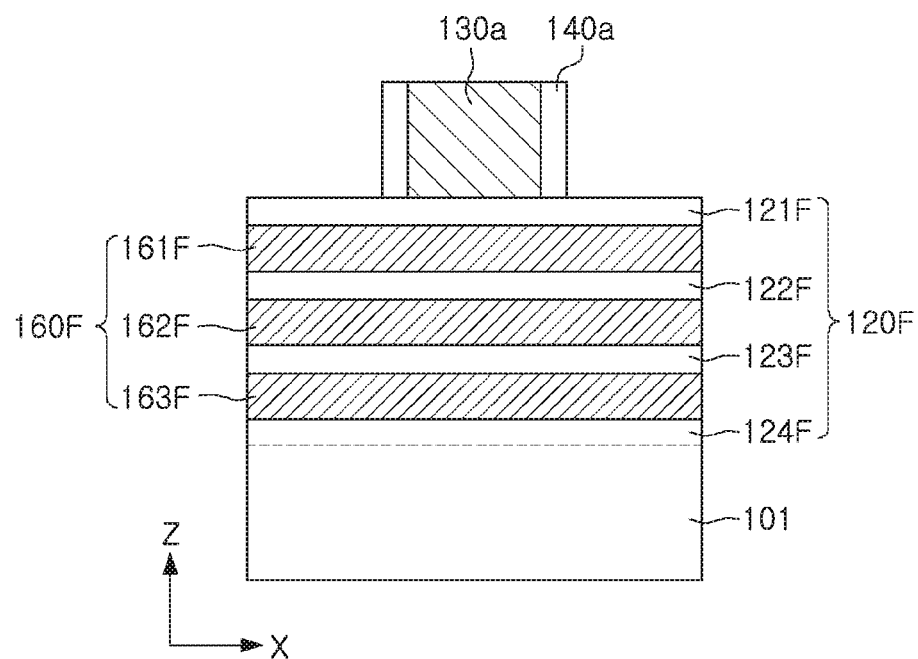
Figure 22:
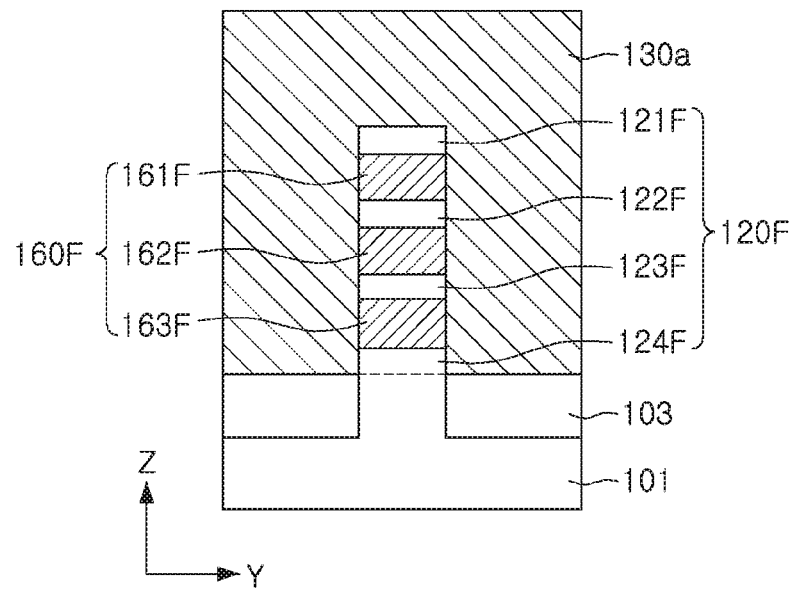
Figure 23:
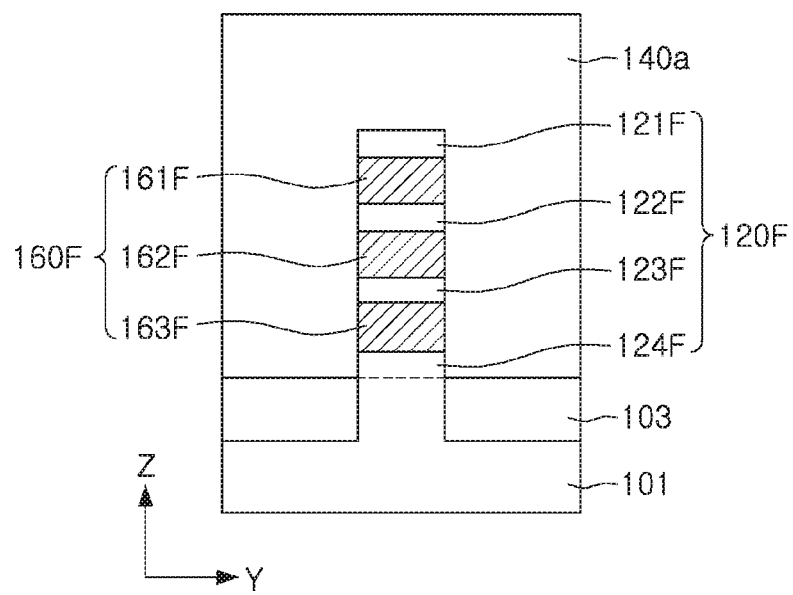

Referring to FIGS. 19 to 23, a dummy gate 130a and first spacers 140a may be formed on the fin structure F. FIG. 20 illustrates a top plan view of the perspective view shown in FIG. 19 as it may be viewed through the X-Y plane. In example embodiments, a capping layer may be further formed on the dummy gate 130a, and a etch stop layer may be further formed between the dummy gate 130a and the plurality of semiconductor layer 120F.

The dummy gate 130a and the first spacers 140a may be formed in a form in which they are in contact with the fin structure F. The dummy gate 130a may be formed of polysilicon, or the like, and the first spacers 140a may be formed using an insulating material such as silicon oxide, silicon nitride, and the like.

The dummy gate 130a may be replaced with a gate electrode 130 in a subsequent process. Accordingly, a gate length Lg of the gate electrode 130 may be substantially equal to a width of the dummy gate 130a in one direction (direction of a Y-axis in FIGS. 19 to 23). In example embodiments, the width of the dummy gate 130a may be greater than a thickness of each of the plurality of sacrificial layers 160F. Accordingly, in a subsequent process for forming the gate electrode 130 after removing the dummy gate 130a, a space in which sacrificial layers 160F are removed, may be filled with the gate electrode 130 without voids.

In example embodiments, the width of the dummy gate 130a may be determined by greater than or equal to about 1.2 times the value of each thickness of the plurality of sacrificial layers 160F. In addition, the width of the dummy gate 130a may be substantially the same as a sum of each thickness of the plurality of semiconductor layers 120F and each thickness of the plurality of sacrificial layers 160F.

Figure 24:
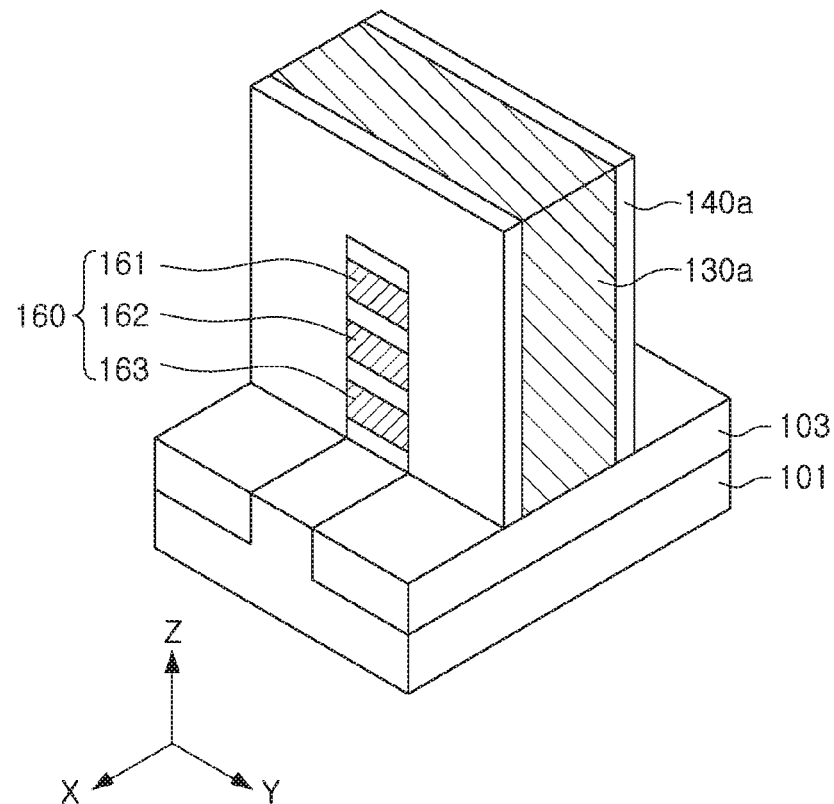
Figure 25:
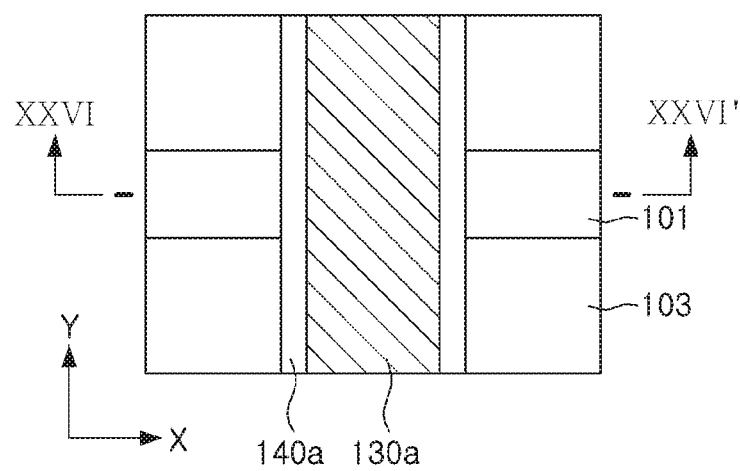
Figure 26:
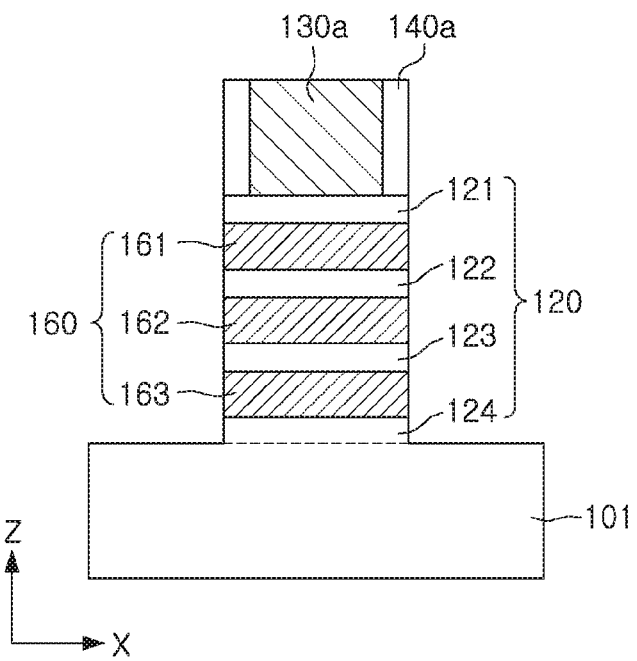

Referring to FIGS. 24 TO 26, by performing an etching process using the dummy gate 130a and the first spacers 140a as an etch mask, at least a portion of the fin structure F may be removed to form a plurality of nanosheets 121 to 124 (nanosheets 120). Each of the plurality of nanosheets 120 may be surrounded by the dummy gate 130a and the first spacers 140a. The plurality of sacrificial layers 161 to 163 (sacrificial layers 160) may be disposed between the plurality of nanosheets 120.

As illustrated in FIGS. 24 to 26, a portion of an upper surface of the substrate 101 may be exposed externally from the dummy gate 130a and the first spacers 140a. The upper surface of the substrate 101 may be used to form source/drain regions 104 and 105 using an epitaxial process.

Figure 27:
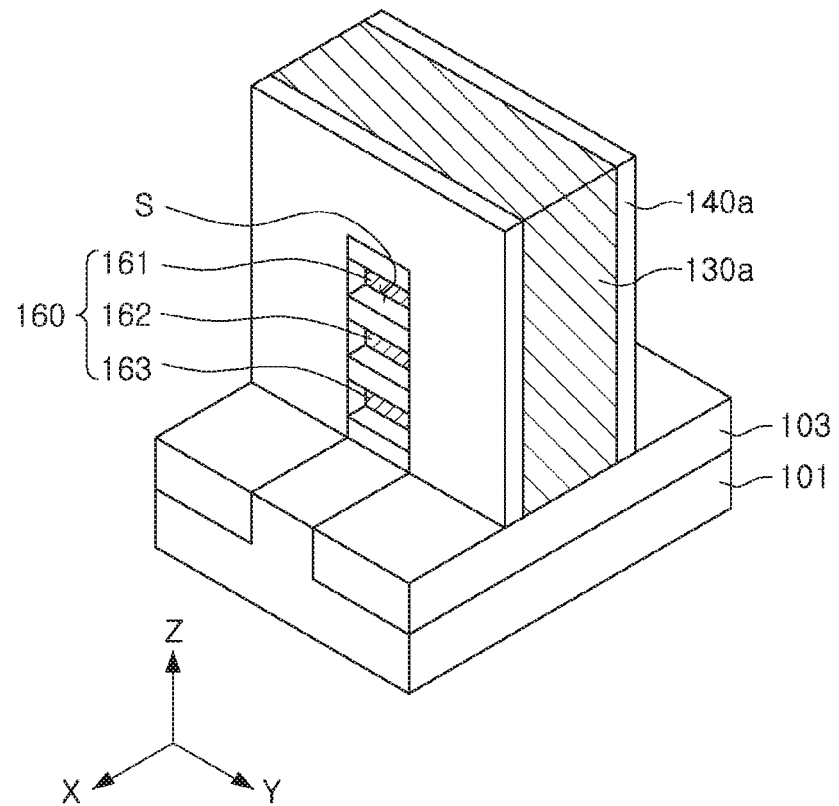
Figure 28:
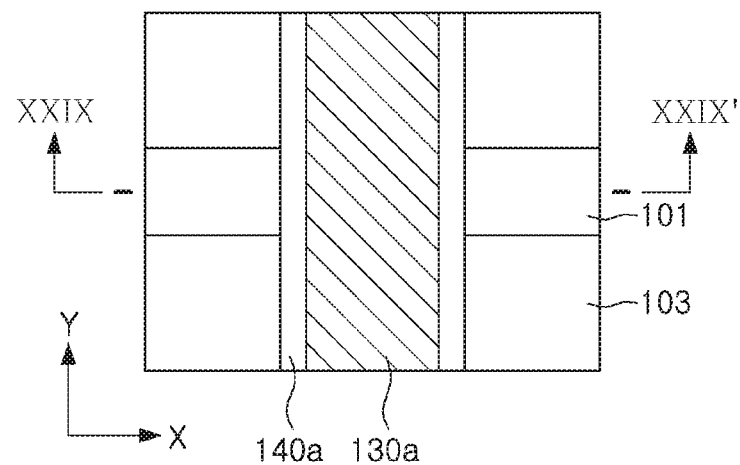
Figure 29:
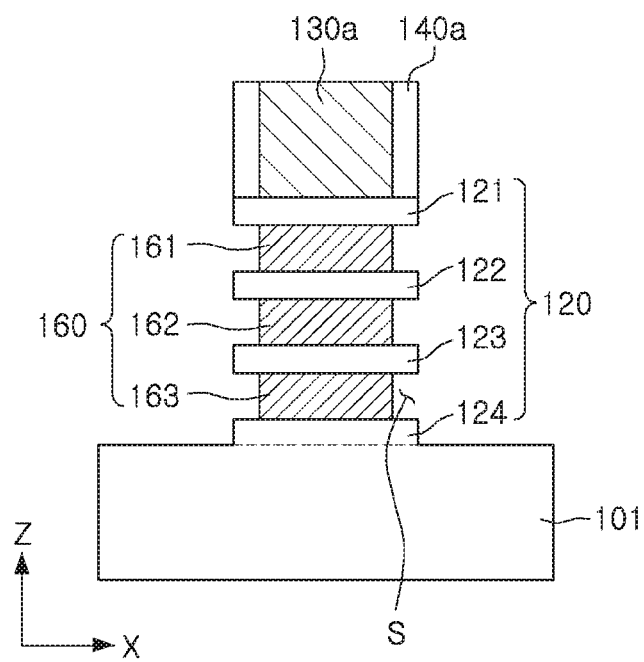

Referring to FIGS. 27 to 29, portions of the sacrificial layers 160 exposed on the sides of the dummy gate 130a and the first spacers 140a may be removed to form a spacer space S. As illustrated FIGS. 27 to 29, at least portions of the first to third sacrificial layers 161 to 163 may be removed to form the spacer space S. In this case, a depth of the spacer space S may be substantially equal to a thickness of the first spacer 140a.

Figure 30:
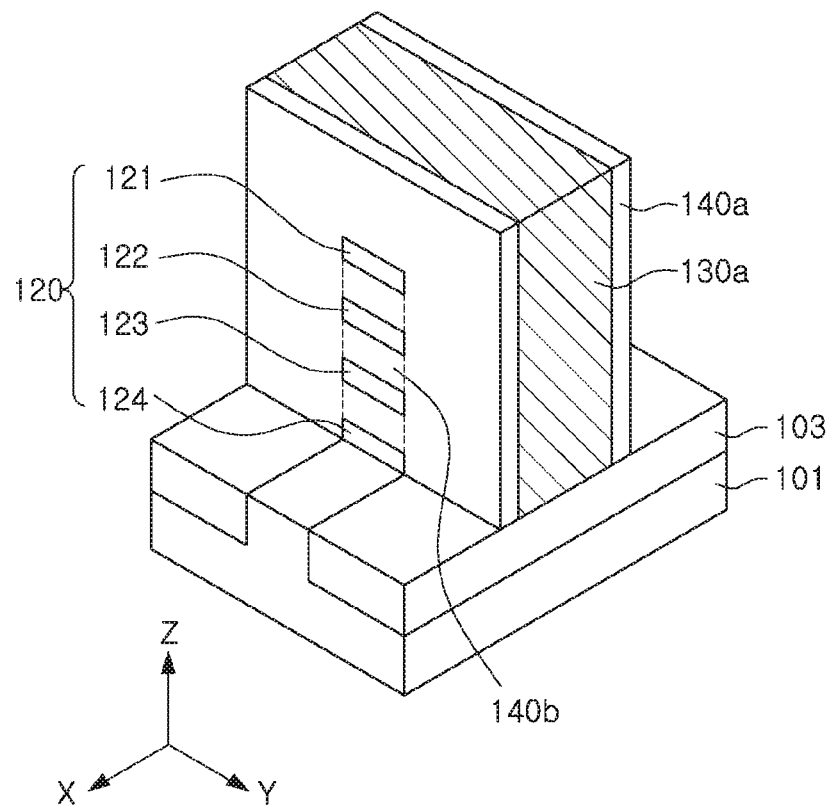
Figure 31:
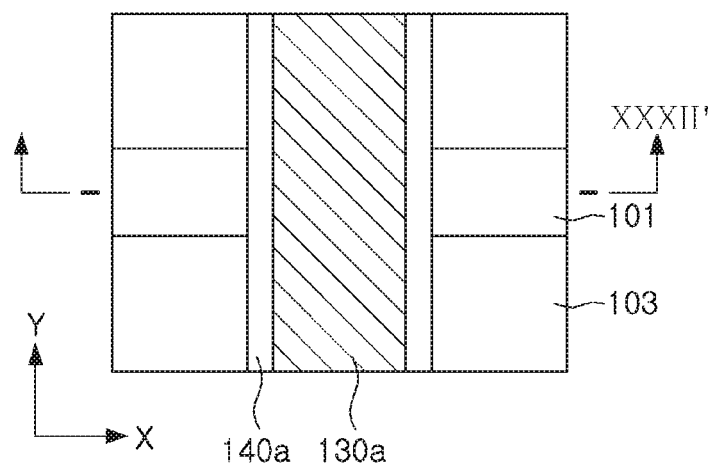
Figure 32:
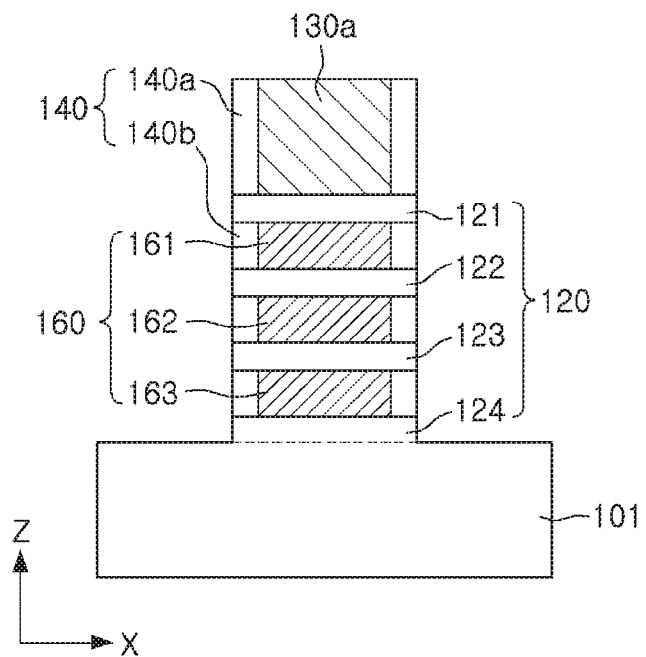

Referring to FIGS. 30 to 32, second spacers 140b may be formed by filling the spacer spaces S with an insulating material. A thickness of the second spacers 140b may be substantially equal to that of the first spacers 140a. An outer surface of the second spacer 140b may be coplanar with an outer surface of the first spacer 140a. The first spacers 140a and the second spacers 140b may be provided as the spacers 140 surrounding a gate electrode that will be sequentially formed. The second spacer 140b may be formed of the same material as that of the first spacer 140a. In example embodiments, the first spacers 140a and the second spacers 140b may include silicon oxide, silicon nitride, or the like.

Figure 33:
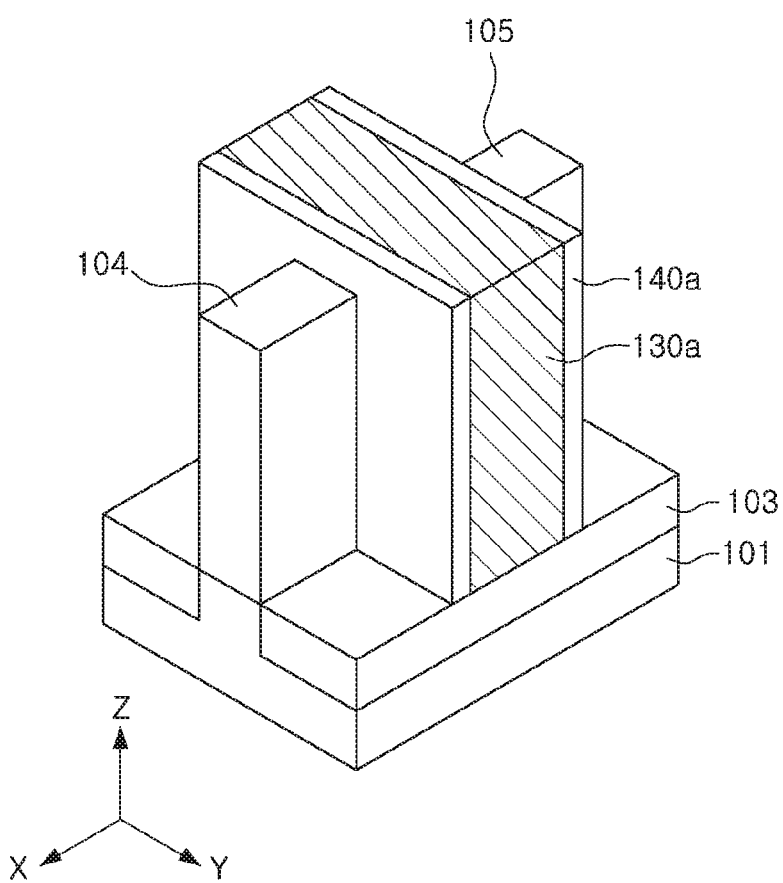
Figure 34:
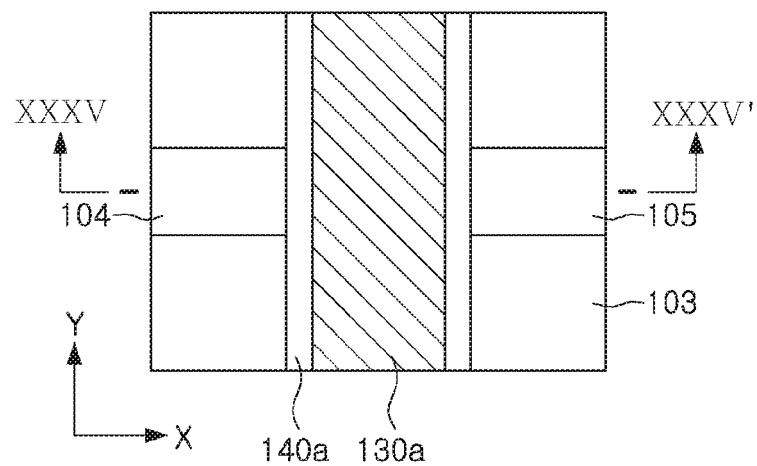
Figure 35:
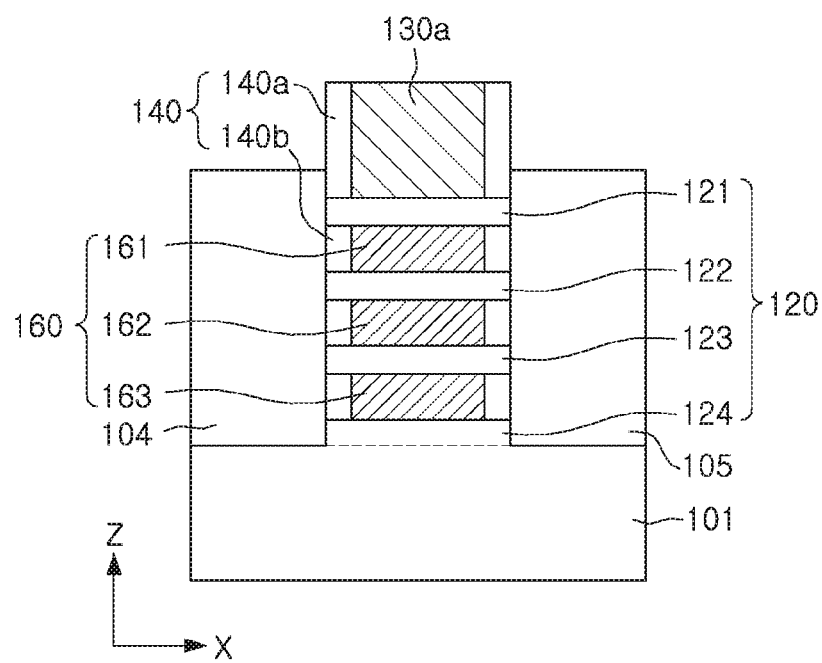

Referring to FIGS. 33 to 35, source/drain regions 104 and 105 may be formed from the upper surface of the substrate 101 using a selective epitaxial growth (SEG). The source/drain regions 104 and 105 may include a semiconductor material doped with a desired (and/or alternatively predetermined) impurity. A thickness of the source/drain regions 104 and 105 may be variously changed. Upper surfaces of the source/drain regions 104 and 105 may be coplanar with an upper surface of the nanosheet 121 disposed on an uppermost level of the nanosheets 120.

Figure 36:
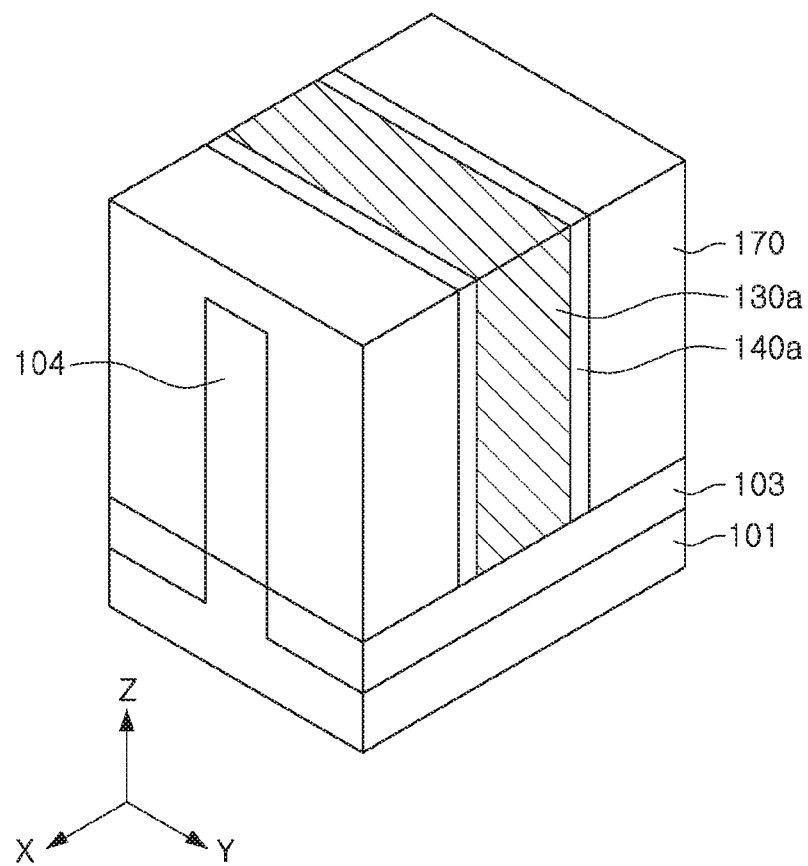
Figure 37:
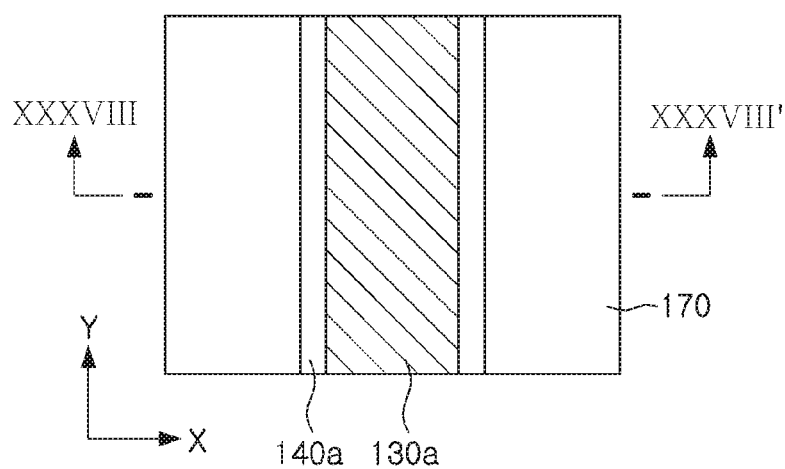
Figure 38:
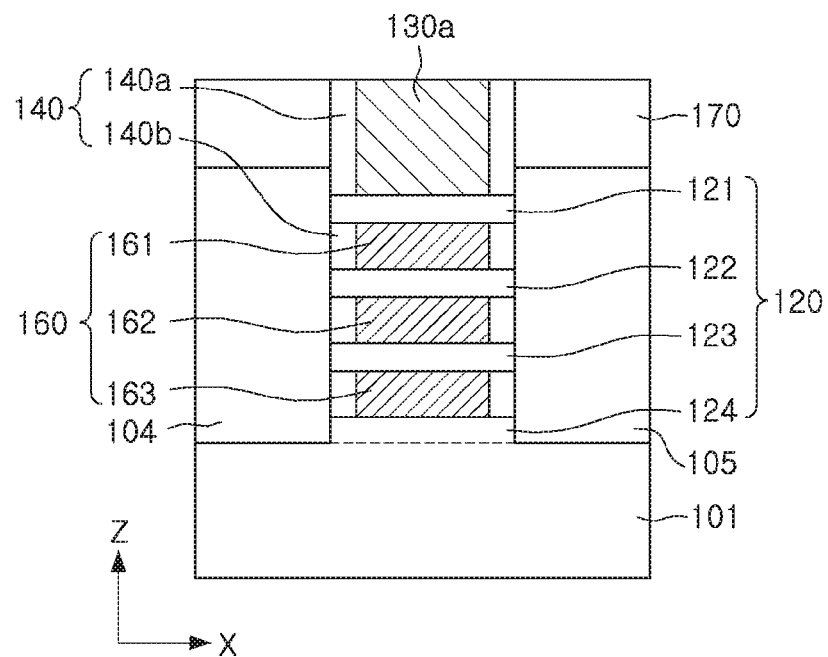

Referring to FIGS. 36 to 38, an interlayer insulating layer 170 may be formed on the substrate 101. The interlayer insulating layer 170 may be formed to cover outer sides of the spacers 140 and the source/drain regions 104 and 105.

Figure 39:
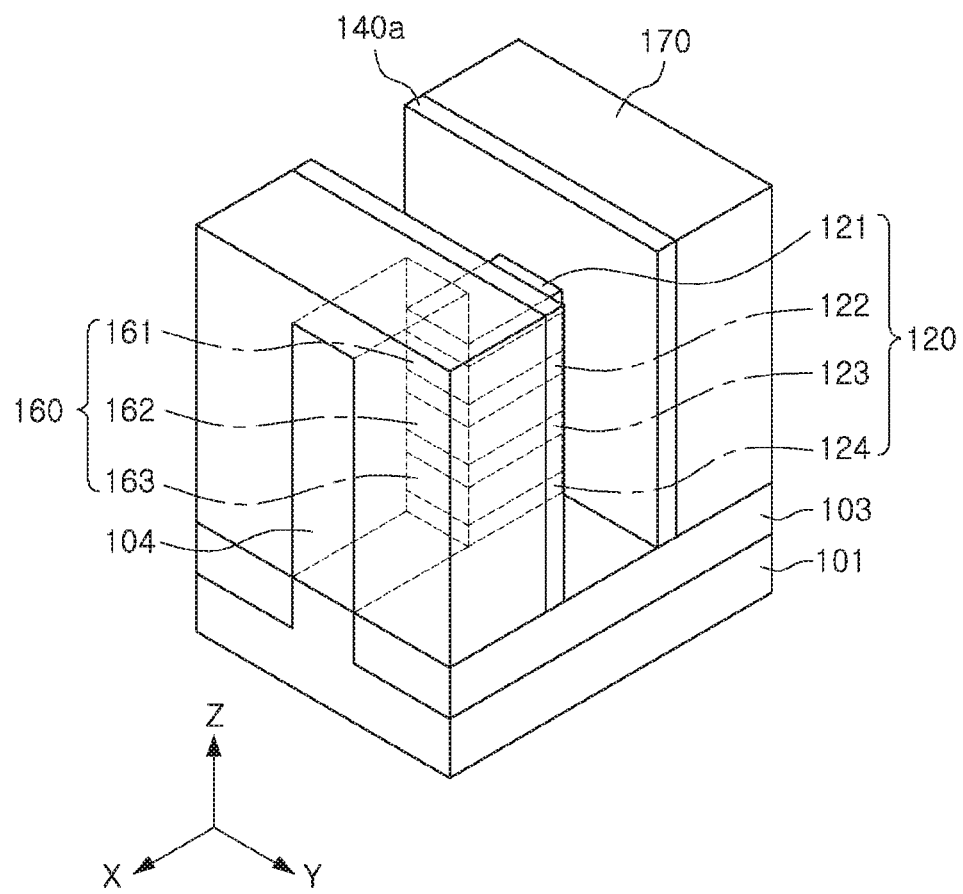
Figure 40:
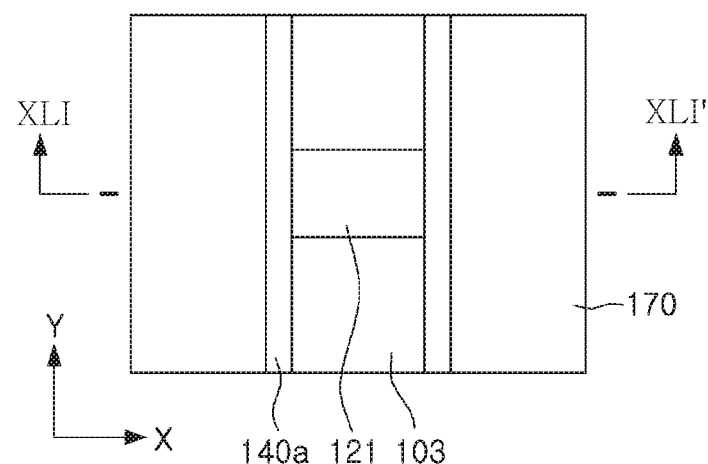
Figure 41:
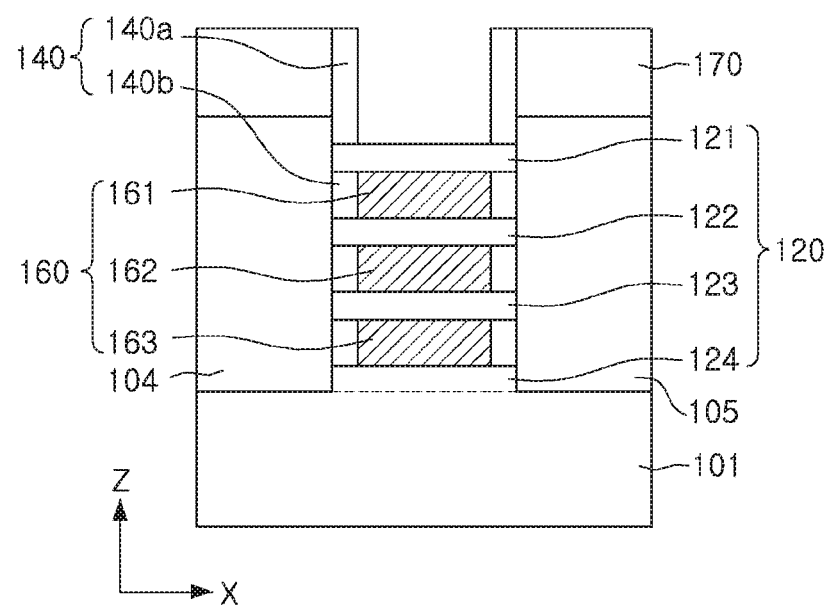
Figure 42:
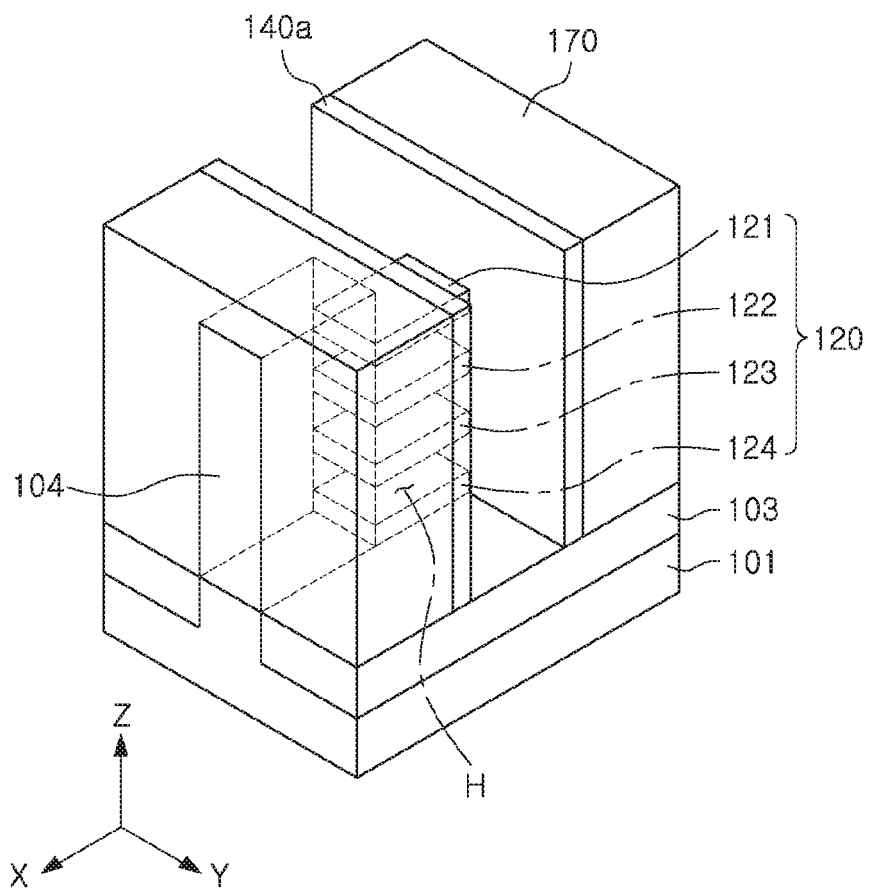

Referring to FIGS. 39 to 41, the dummy gate 130a may be removed. The dummy gate 130a may be selectively removed based on an etching selectivity of the dummy gate 130a with respect to the first spacers 140a and the source/drain regions 104 and 105. The nanosheets 121 to 124 and the sacrificial layers 161 to 163 may be exposed externally from a space between the first spacers 140a by removing the dummy gate 130a.

Referring to FIGS. 42 to 45, the sacrificial layers 160 may be selectively removed to form horizontal openings H. As described above, the sacrificial layer 160 may include a different material from the nanosheets 120, such as a material having a desired (and/or alternatively predetermined) etching selectivity with respect to a material included in the nanosheets 120. In example embodiments, the nanosheets 120 may include a semiconductor material, such as silicon, to provide a channel region of the semiconductor device 100, and the sacrificial layers 160 may include silicon germanium. In order to selectively remove exposed portions of the sacrificial layers 160 while suppressing the etching of the nanosheets 120, an etchant having a significant etching selectivity of silicon germanium (SiGe) with respect to silicon (Si) may be used. For example, an etchant including hydrogen peroxide $(H_2O_2)_r$ hydrofluoric acid (HF), and acetic acid ($CH_3COOH$), an etchant including ammonium hydroxide ($NH_4OH$), hydrogen peroxide ($H_2O_2$), and deionized water ($H_2O$), and an etchant including peracetic acid, or a combination thereof may be used.

When the sacrificial layers 160 are removed, the nanosheets 120 may be separated from each other. Referring to FIG. 44, the nanosheets 120 may be separated from each other in a direction of the Z-axis, and a spacing $T_N$ between the nanosheets 120 may be less than a spacing $W_D$ between the first spacers 140a. In example embodiments, the spacing $W_D$ between the first spacers 140a may be greater than or equal to about 1.2 times the spacing $T_N$ between the nanosheets 120. Accordingly, in a subsequent process for forming agate insulating layer 110 and a gate electrode 130, the horizontal openings H may be first filled with the gate insulating layer 110 and the gate electrode 130 before filling the space between the first spacers 140a with them. Accordingly, it may be limited (and/or prevented) that voids may be generated from the incompletely filled horizontal openings H.

Figure 45:
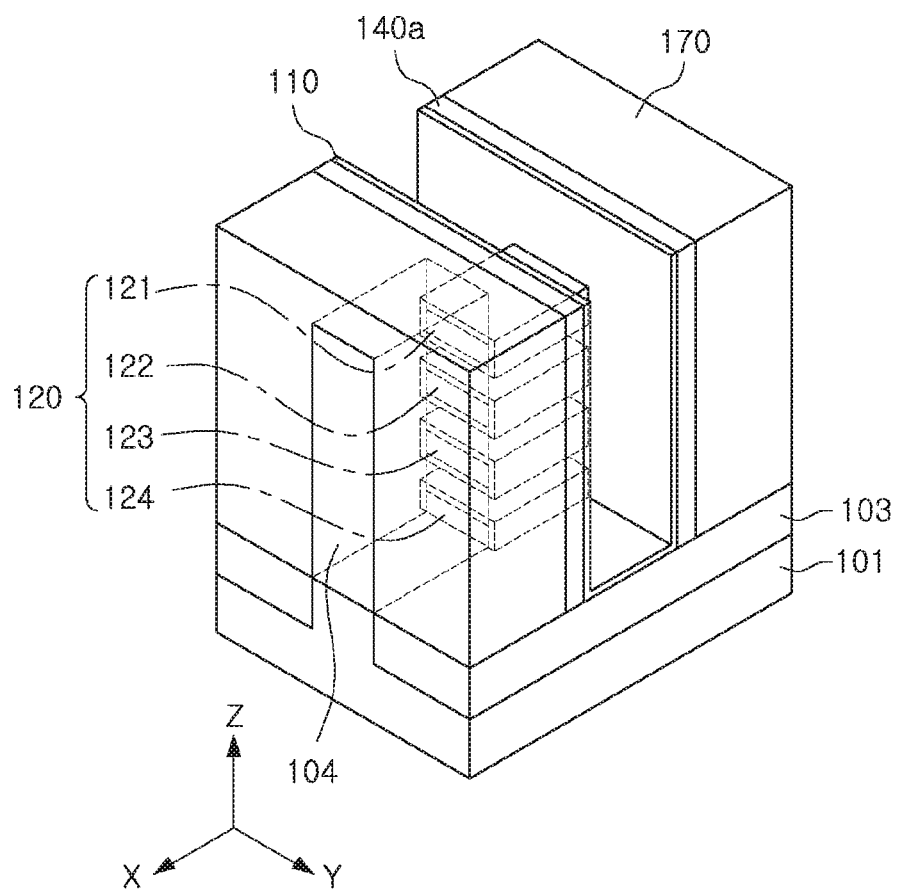
Figure 46:
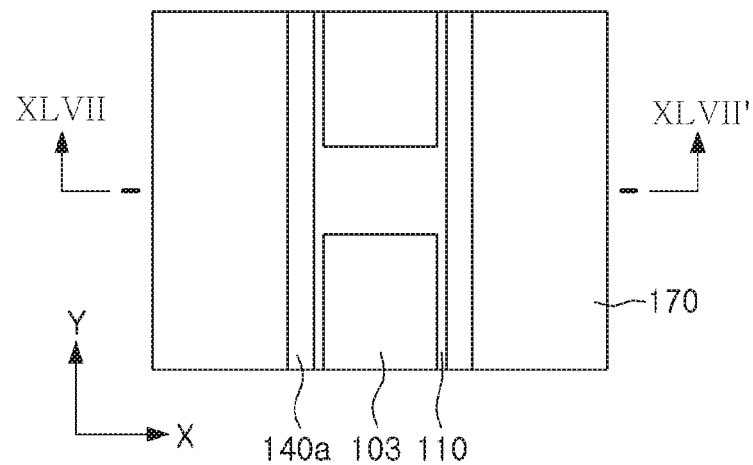
Figure 47:
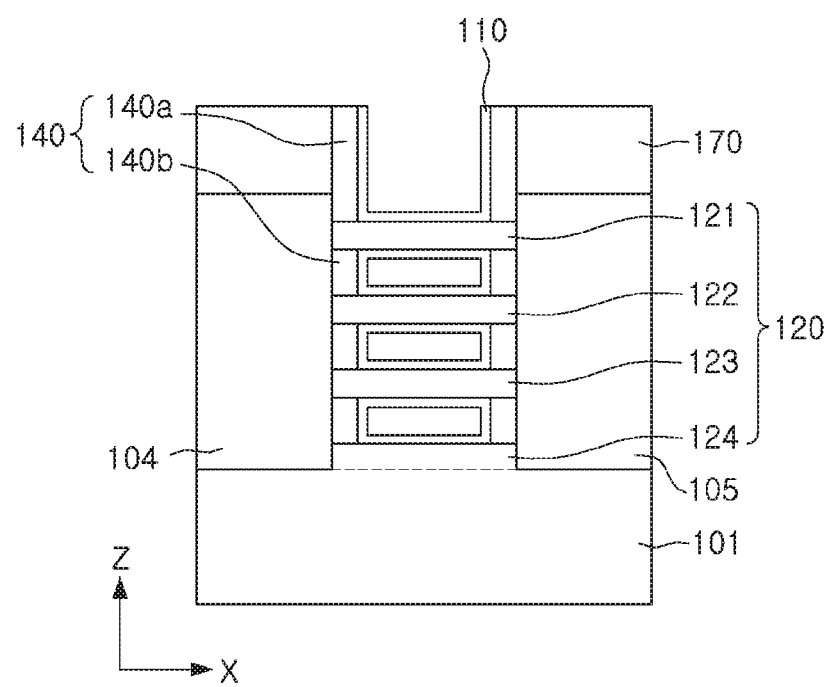

Referring to FIGS. 45 to 47, a gate insulating layer may be formed. The gate insulating layer 110 may be disposed on inner surfaces of the first spacers 140a and the horizontal openings H between the nanosheets 120. In example embodiments, the gate insulating layer 110 may be disposed to surround the nanosheets 120 in directions of the Y- and Z-axes, and the horizontal openings H may not be completely filled with the gate insulating layer 110. In other words, after forming the gate insulating layer 110, there may still exist spaces between the nanosheets 120.

The gate insulating layer 110 may include a first insulating layer and a second insulating layer which have different permittivities from each other. The permittivity of the second insulating layer may be greater than that of the first insulating layer. The first insulating layer may be disposed closer to the first spacer 140a and nanosheet 120 than the second insulating layer. In other words, the first insulating layer may be formed before forming the second insulating layer.

The gate insulating layer 110 may be formed through a process such as atomic layer deposition (ALD), chemical vapor deposition (CVD), or the like. In example embodiments, the second insulating layer may be formed thicker than the first insulating layer. For example, a thickness of the first insulating layer may be less than about 1 nm, and a thickness of the second insulating layer may be about 1 nm to about 2 nm.

Figure 48:
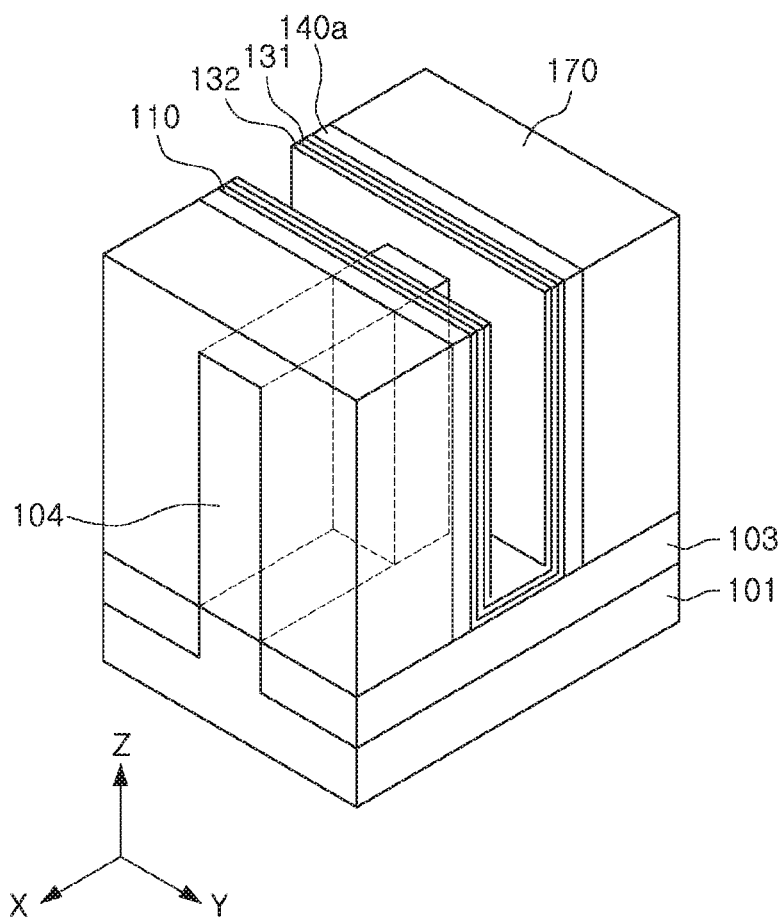
Figure 49:
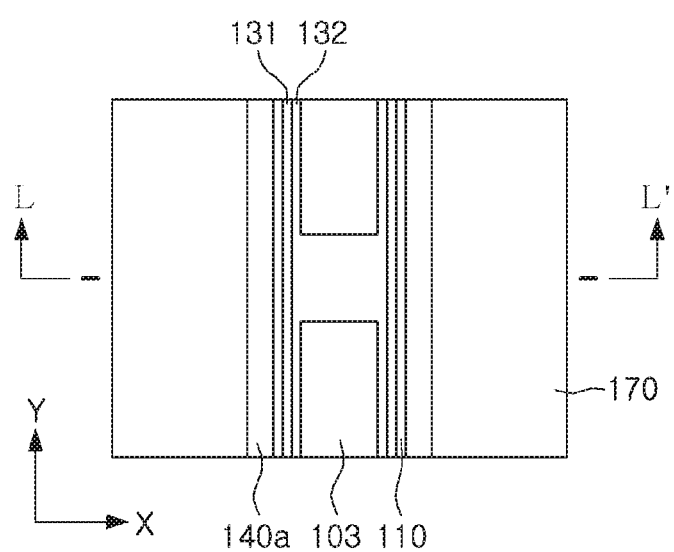
Figure 50:
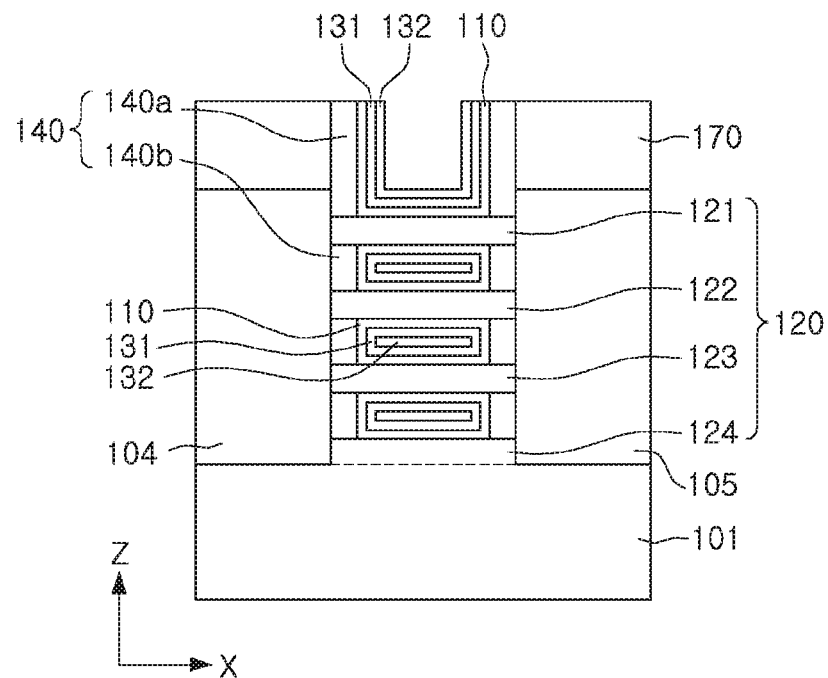

Referring to FIGS. 48 to 50, a barrier metal layer 131 and a first work function metal layer 132 may be sequentially formed on the gate insulating layer 110. The space between the nanosheets 120 may be entirely filled with the barrier metal layer 131 and the first work function metal layer 132. Accordingly, as illustrated FIGS. 48 to 50, only the first work function metal layer 132 may be exposed externally from the nanosheets 120.

Referring to FIG. 50, the space between the nanosheets 120 may be completely filled with the gate insulating layer 110, the barrier metal layer 131 and the first work function metal layer 132. Meanwhile, referring to FIG. 48, a space where nanosheets 120 are not disposed between the first spacers 140a may be not completely filled with the gate insulating layer 110, the barrier metal layer 131 and the first work function metal layer 132. In other words, it may be limited (and/or prevented) from generating voids from the incompletely filled space because the space between the nanosheets 120 is filled first.

Figure 51:
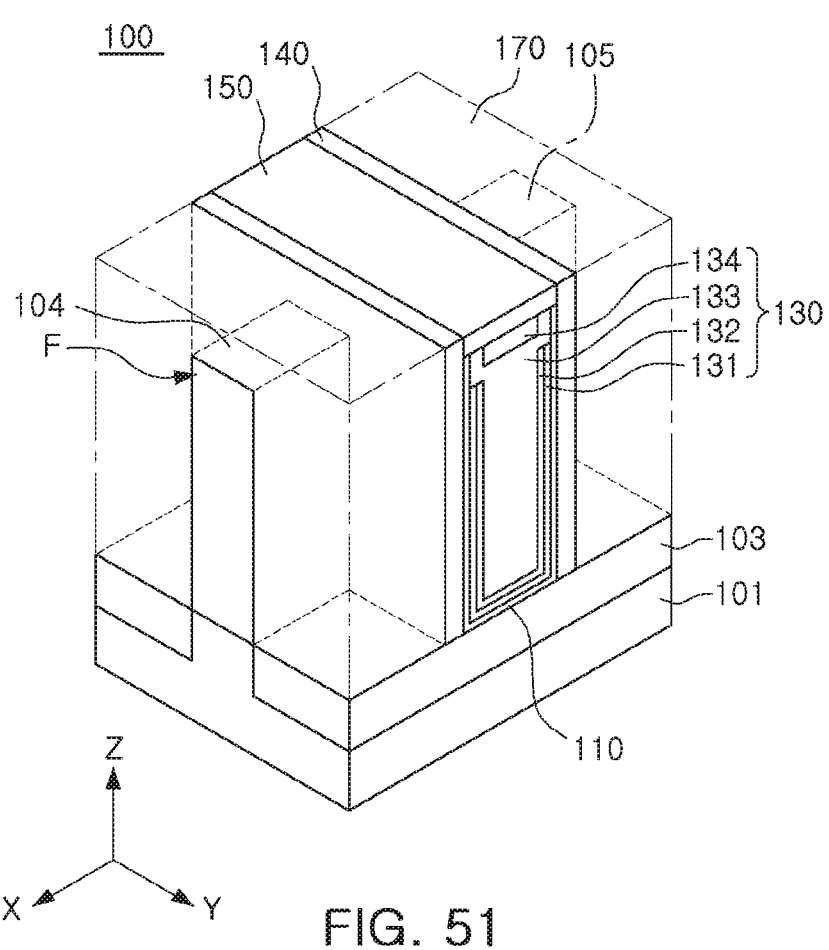
Figure 52:
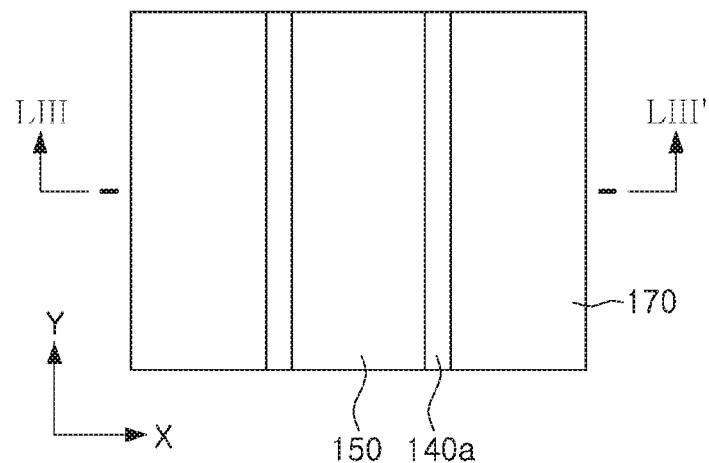
Figure 53:
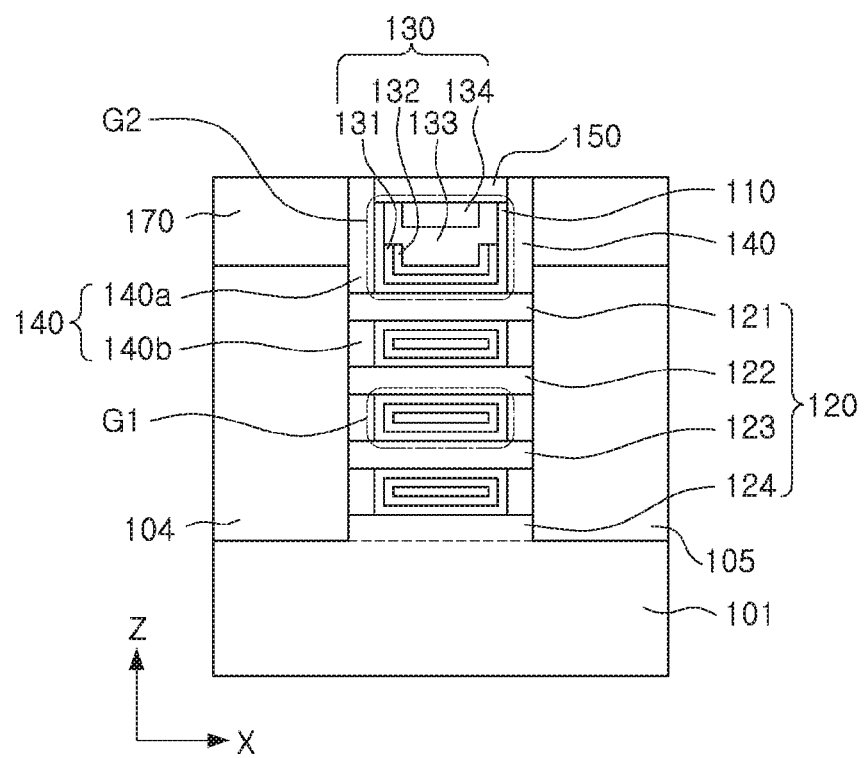

Referring to FIGS. 51 to 53, the second work function metal layer 133 and the gate metal layer 134 may be formed on the first work function metal layer 132. The second work function metal layer 133 may include a material different from the first work function metal layer 132. A threshold voltage of the semiconductor device 100 may be determined by a material and a thickness of each of the work function metal layers 132 and 133. The gate metal layer 134 may be disposed on the second work function metal layer 133, and a protection layer 150 may be further provided on the gate metal layer 134.

The protection layer 150 may be formed of a silicon nitride layer having a thickness in the range of several to several hundreds of angstroms (e.g., 3 Å to 800 Å). The protection layer 150 may be formed for the purpose of limiting (and/or preventing) deterioration of a threshold voltage induced by permeating oxygen into the gate electrode 130. A portion of the gate electrode 130 may be removed, and the protection layer 150 may be formed in the removed portion of the gate electrode.

Referring to FIG. 53, the gate electrode 130 may include a first region G1 disposed between adjacent ones of the nanosheets 120, and a second region G2 other than the first region G1. Because the first region G1 is defined as a region disposed between adjacent ones of the nanosheets 120, the gate electrode in FIG. 53 may include a total of three first regions G1.

The first and second regions G1 and G2 may have different stack structures from each other. The first region G1 may only include the barrier metal layer 131, the first work function metal layer 132, and the second region may include the barrier metal layer 131, the first and second work function metal layer 132 and 133 and the gate metal layer 134. The number of metal layers included in the first region G1 may be less than the number of metal layers included in the second region G2. The number and type of metal layers of each of the first and second regions G1 and G2 may be variously changed.

In a process of fabricating the semiconductor device 100 according to example embodiments of inventive concepts, as illustrated in FIGS. 19 to 23, the spacing $W_D$ between the first spacers 140a may be greater than the thickness of each of the sacrificial layers 160F. The spacing $W_D$ between the first spacers 140a may be determined by a width of the dummy gate 130a. The gate electrode 130 may be formed in a region in which the dummy gate is removed. The gate length Lg of the gate electrode 130 may be greater than the spacing $T_N$ between the nanosheets 120. Accordingly, by forming the dummy gate 130a having the width greater than the thickness of each of the sacrificial layers 160F, the space between the nanosheets 120 may be filled with the gate electrode 130 without voids.

Figure 54:
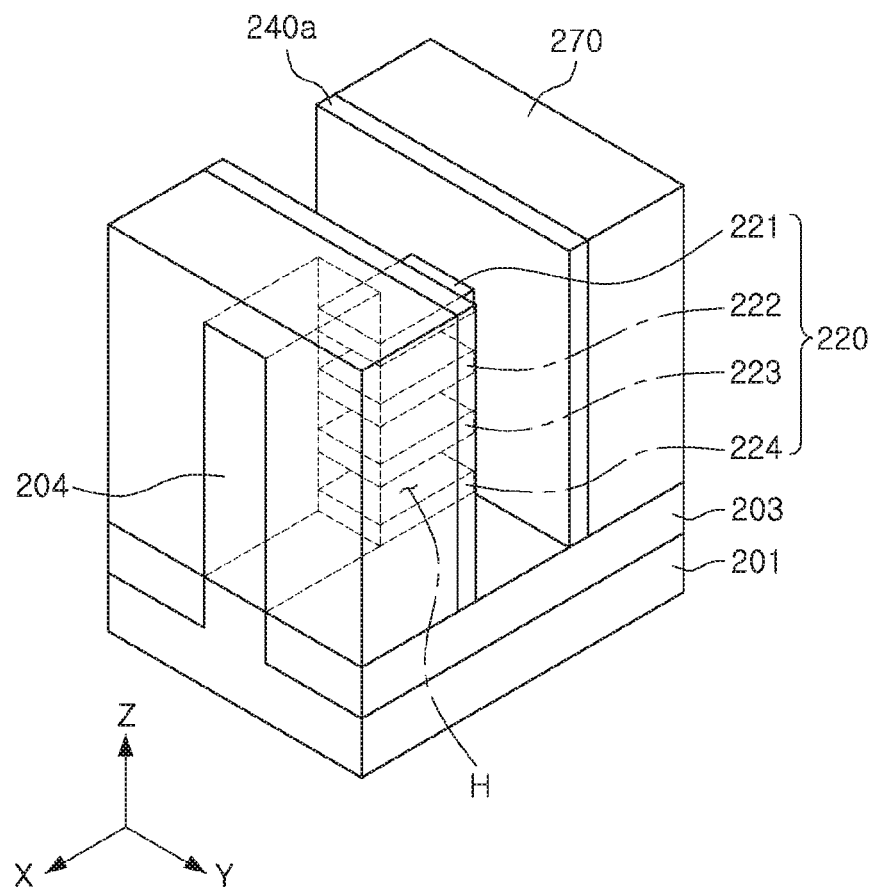
FIGS. 54 to 65 are drawings illustrating a method for fabricating the semiconductor device illustrated in FIG. 7.
Figure 55:
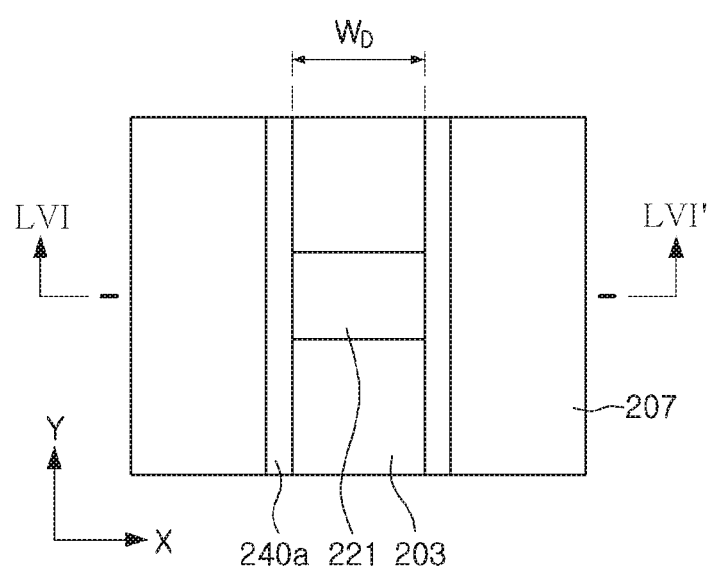
Figure 57:
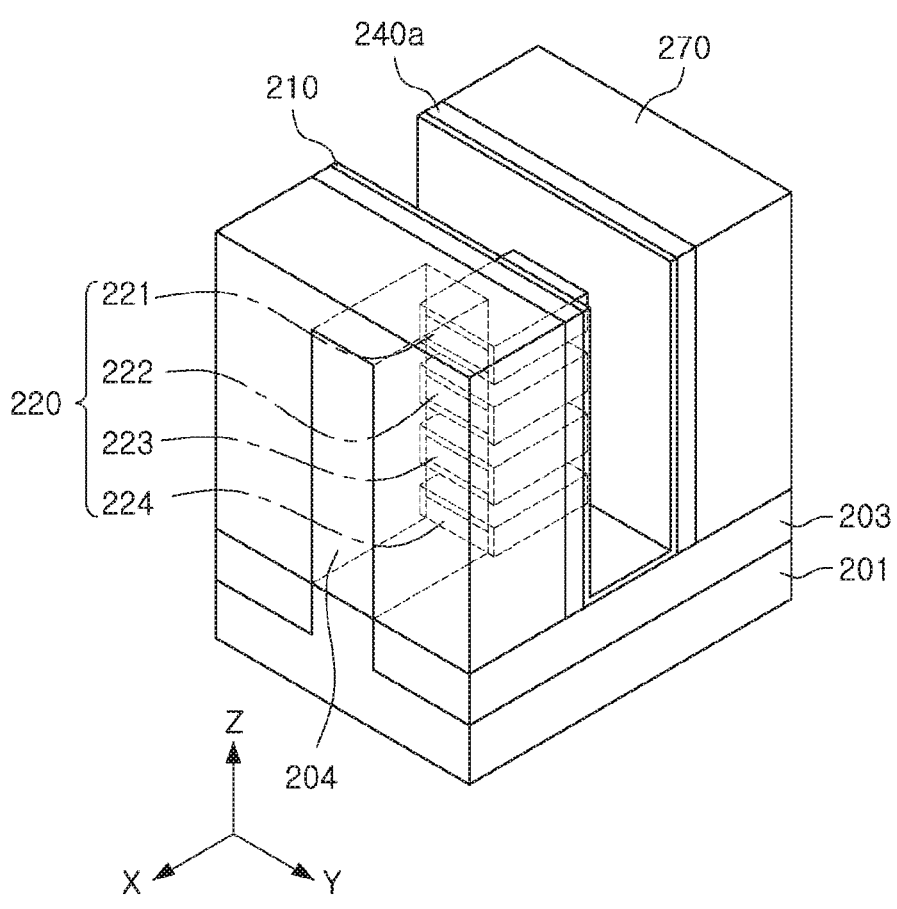
Figure 58:
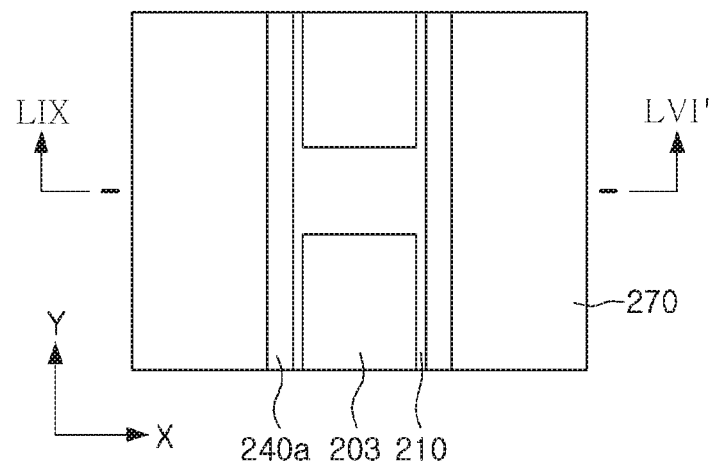
Figure 59:
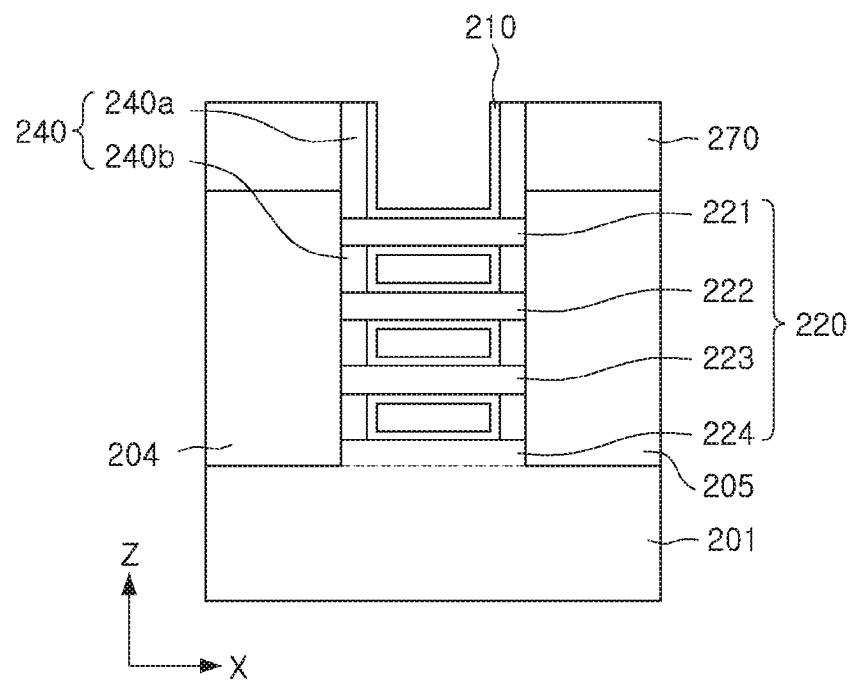
Figure 60:
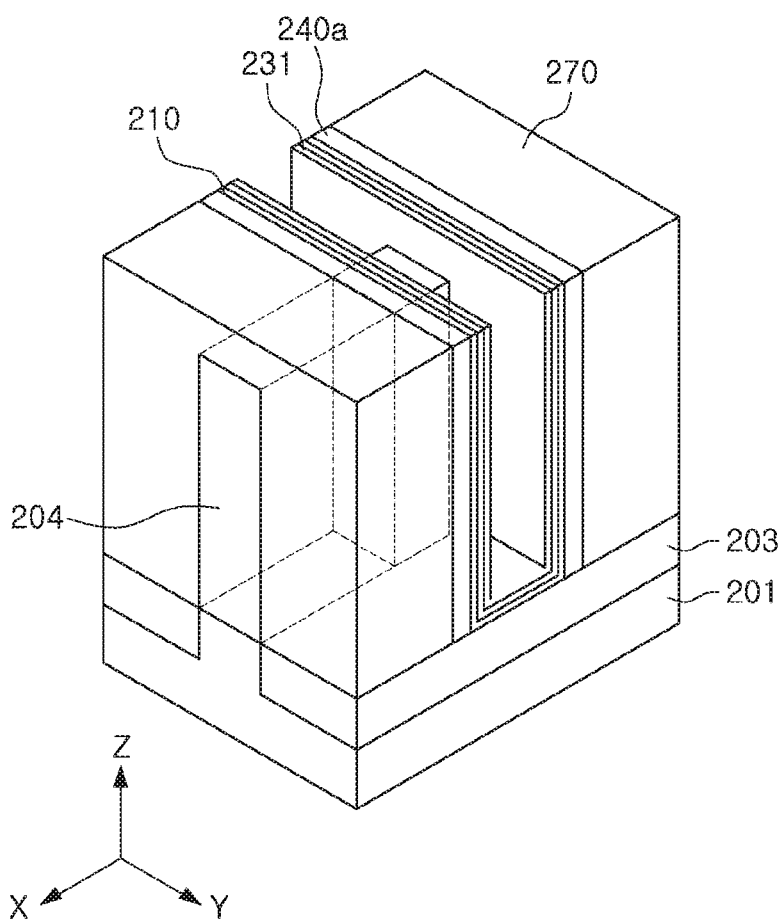
Figure 61:
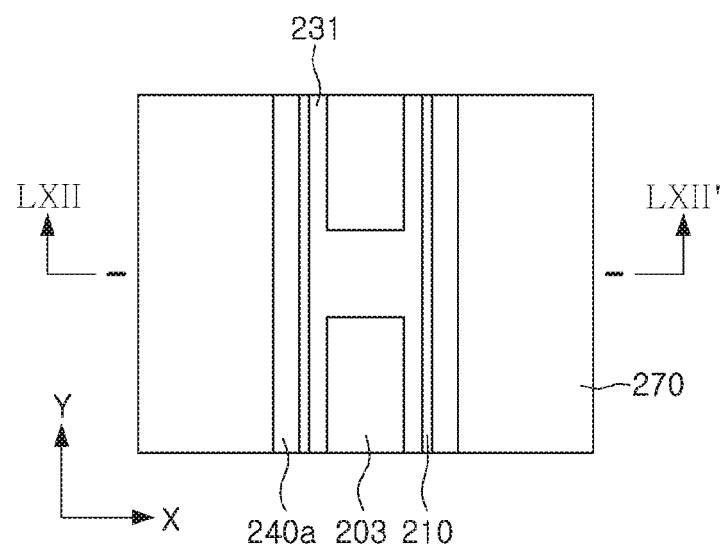
Figure 62:
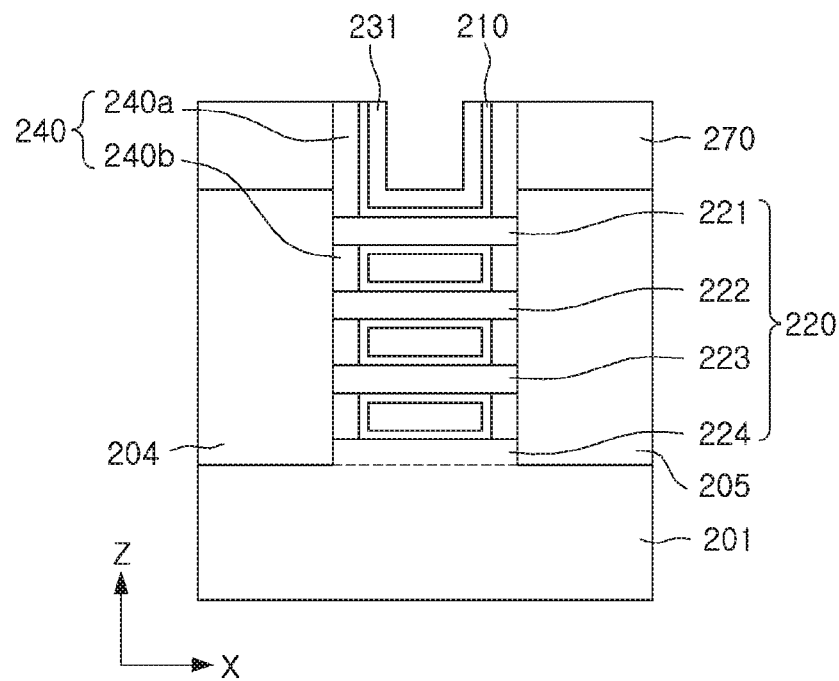
Figure 63:
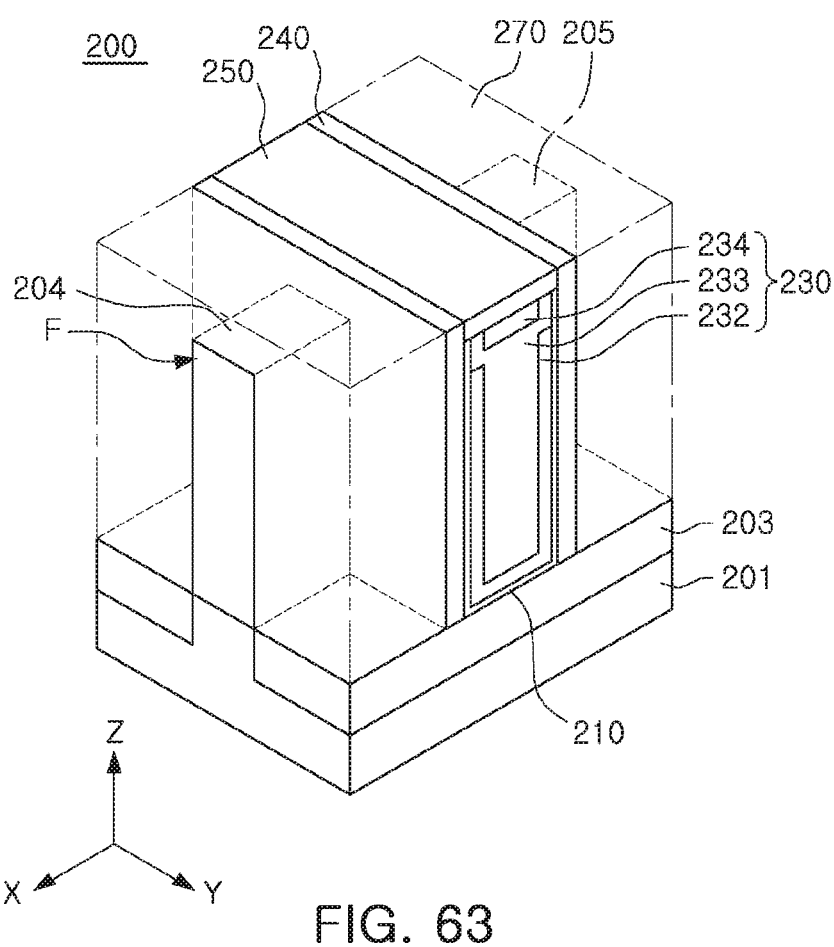
Figure 64:
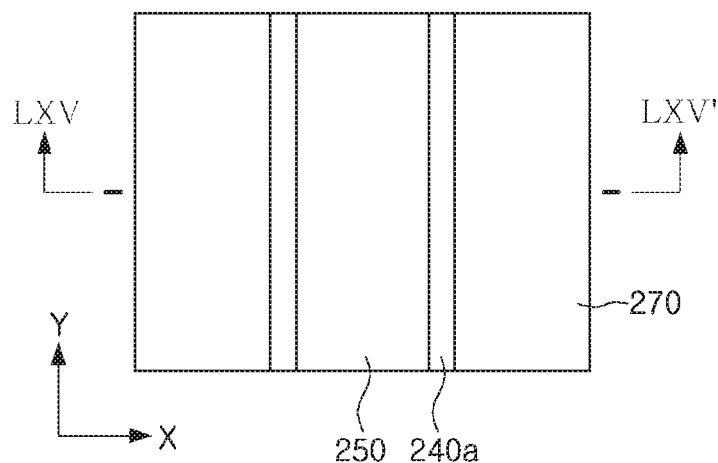
Figure 65:
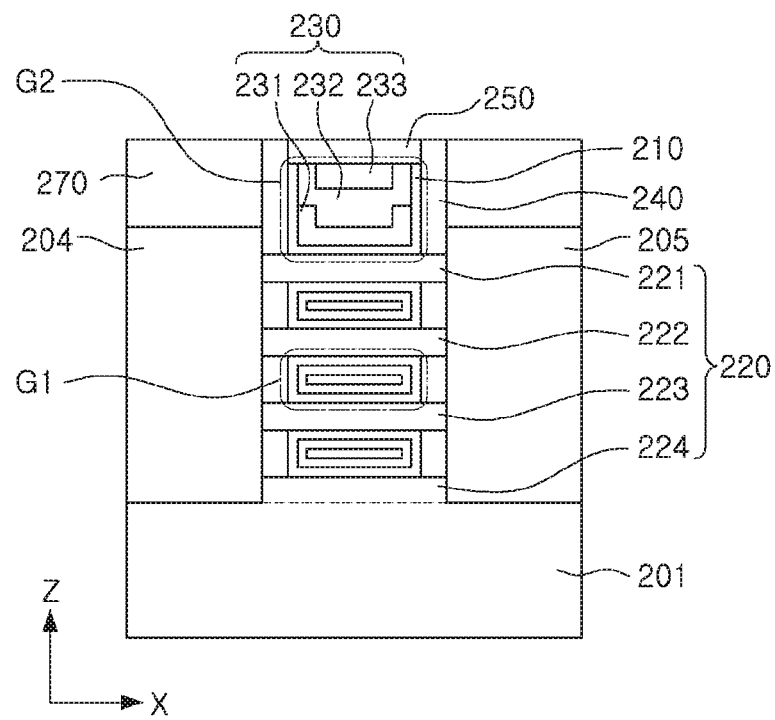

FIGS. 54 to 65 are drawings illustrating a method for fabricating the semiconductor device illustrated in FIG. 7. FIG. 55 is a cross-sectional view taken along line LVI-LVI' of FIG. 54. FIG. 59 is a cross-sectional view taken along line LIX-LIX' of FIG. 58. FIG. 62 is a cross-sectional view taken along line LXII-LXII'. FIG. 65 is a cross-sectional view taken along line LXV-LXV' of FIG. 64.

Figure 56:
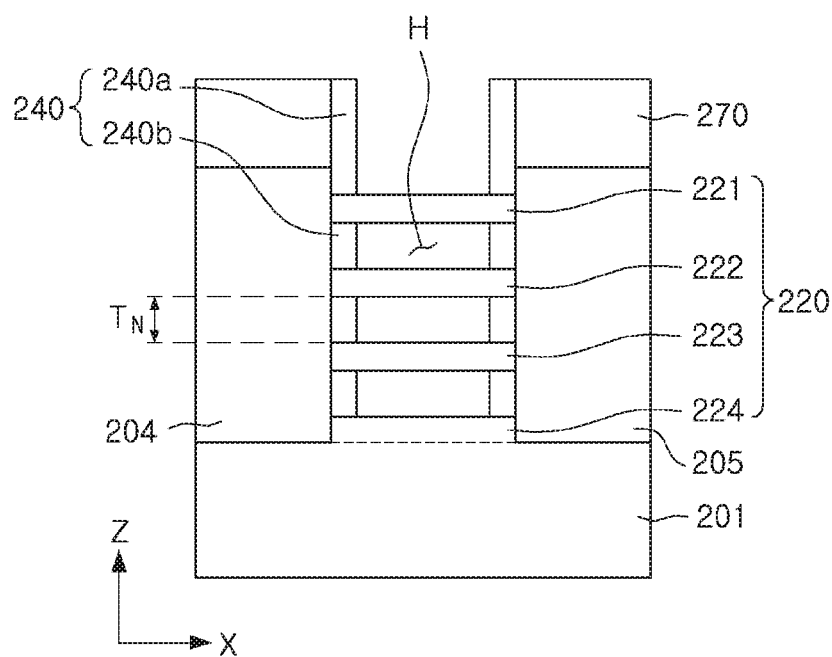

Referring to FIGS. 54 to 56, a dummy gate formed on a substrate 201 may be removed to expose a plurality of nanosheets 221 to 224 (nanosheets 220) in a space between first spacers 240a. Sacrificial layers may be selectively removed to form horizontal openings H. A spacing $T_N$ between adjacent ones of the nanosheets 220 may be less than a width $W_D$ between the first spacers 240a.

Referring to FIGS. 57 to 59, the space between the first spacers 240a and the horizontal openings H between the nanosheets 220 may be filled a gate insulating layer 210

As illustrated in FIG. 9, the gate insulating layer 210 may include a first insulating layer 211 and a second insulating layer 212. The first and second insulating layer 211 and 212 may have different permittivities from each other. Each of the nanosheets 220 may be surrounded by the gate insulating layer 210. The space between the nanosheets 120 may not be completely filled with the gate insulating layer 210.

Referring to FIGS. 60 to 62, a first work function metal layer 231 may be formed on the gate insulating layer 210. The space between the nanosheets 220 may be filled with the first work function metal layer 231. Accordingly, as illustrated in FIG. 60, the first work function metal layer 231 may be exposed externally from the nanosheets 220. The space between the nanosheets 220 may be completely filled with the gate insulating layer 210 and the first work function metal layer 231 without void.

In example embodiments, a spacing $T_N$ between the nanosheets 220, a thickness of the gate insulating layer 210 and a thickness of the first work function metal layer 231 may have a relationship such as Equation 2 below. According to the relationship such as Equation 2, by forming the spacing $T_N$ between the nanosheets 220, the gate insulating layer 210 and the first work function metal layer 231, the space between the nanosheets 220 may be completely filled with the gate insulating layer 210 and the first work function metal layer 231.

$$T_N \leq (a\text{thickness of }a\text{gate insulating layer} + a\text{thickness of }a\text{first work function metal layer})*2 \quad \text{[Equation 2]}$$

Referring to FIGS. 63 to 65, a second work function metal layer 232 and a gate metal layer 233 may be formed on the first work function metal layer 231. A protection layer 250 may be formed on the gate metal layer 233. The second work function metal layer 232 may include a material different from the first work function metal layer 231. A threshold voltage of the semiconductor device 200 may be determined by thickness and material of each of the first and second work function metal layers 231 and 232.

Referring to FIG. 65, the gate electrode 230 may include a first region G1 and a second region G2. The first region G1 may be defined as a region disposed between the nanosheets 220, and the second region G2 may be other than the first region G1. The first and second regions G1 and G2 may have stack structures different from each other.

The first region G1 may only include the first work function metal layer 231. On the other hand, the second region G2 may include the first and second work function metal layers 231 and 232 and the gate metal layer 233. In other words, the first region G1 may have a simple stack structure than the second region G2. The gate electrode 230 may have its width greater than its thickness in the first region G1.

In example embodiments of inventive concepts, the semiconductor devices 100 and 200 may be formed on one substrate. In other words, by forming the semiconductor devices 100 and 200 having the gate electrodes 130 and 230 of different stack structures, the semiconductor devices 100 and 200 having different threshold voltages may be provided in one substrate.

In example embodiments of inventive concepts, the structures of the gate electrodes 130 and 230 according to the semiconductor devices 100 and 200 may be variously modified.

For example, the number of the barrier metal layer and the work function metal layer included in the gate electrodes 130 and 230 may be changed, and the barrier metal layer may be disposed between the work function metal layer and the gate metal layer. In this way, by variously modifying the stack structure of each of the gate electrodes 130 and 230, it is possible to fabricate the semiconductor devices 100 and 200 having different threshold voltages.

Figure 66:
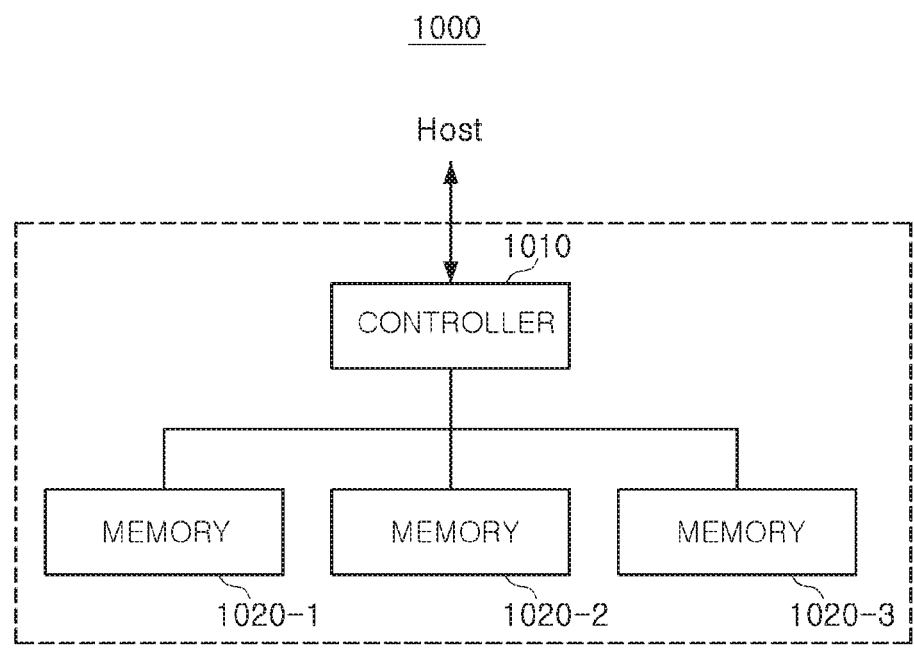
FIGS. 66 and 67 are block diagrams of electronic devices including semiconductor devices according to example embodiments of inventive concepts.
Figure 67:
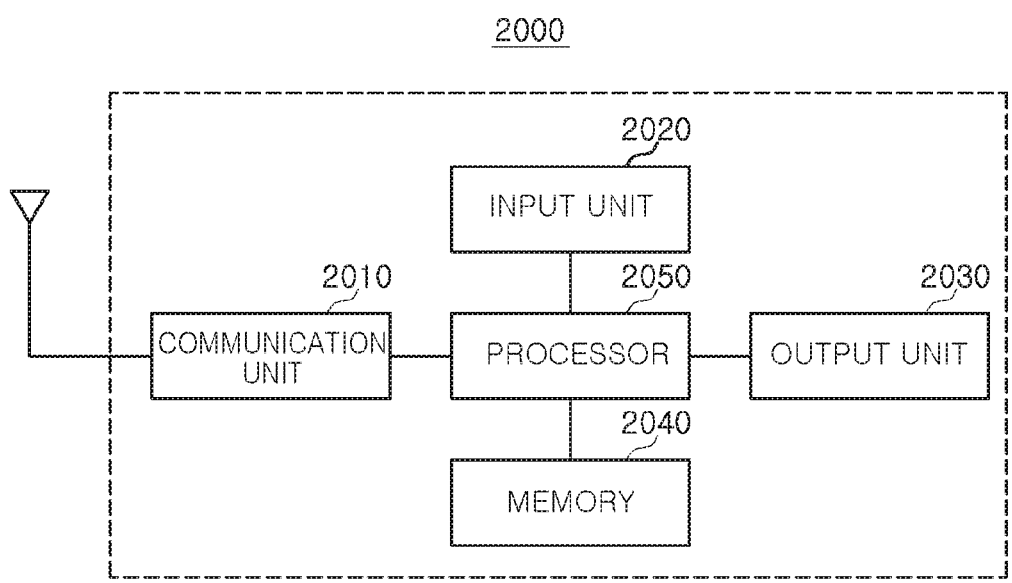

FIGS. 66 and 67 are block diagrams of electronic devices including semiconductor devices according to example embodiments of inventive concepts.

Referring to FIG. 66, according to example embodiments, a storage device 1000 may include a controller 1010 communicating with a host, and memories 1020-1, 1020-2, and 1020-3 storing data. The controller 1010 and the memories 1020-1, 1020-2, and 1020-3 may include the semiconductor devices 100, 200, and 300 according to various example embodiments described above.

The host communicating with the controller 1010 may be various electronic devices equipped with the storage device 1000. For example, the host may be a smartphone, a digital camera, a desktop computer, a laptop computer, a portable media player, or the like. The controller 1010 may store data in the memories 1020-1, 1020-2, and 1020-3 after receiving requests for data writing or reading sent by the host, or may generate a command (CMD) to output data from the memories 1020-1, 1020-2, and 1020-3.

As illustrated in FIG. 66, one or more memories 1020-1, 1020-2, and 1020-3 may be connected to the controller 1010 in parallel in the storage device 1000. By connecting the plurality of memories 1020-1, 1020-2, and 1020-3 to the controller 1010 in parallel, the storage device 1000 having a large capacity, such as a solid state drive (SSD) may be implemented.

Referring to FIG. 67, according to example embodiments, an electronic device 2000 may include a communications unit 2010, an input unit 2020, an output unit 2030, a memory 2040, and a processor 2050.

The communications unit 2010 may include a wired/wireless communications module, for example, a wireless Internet module, a near field communications module, a global positioning system (GPS) module, a mobile communications module, and the like. The wired/wireless communications module included in the communications unit 2010 may transmit and receive data by being connected to external communications networks according to various communications standards.

The input unit 2020 may be a module provided for users to control operations of the electronic device 2000 and may include a mechanical switch, a touchscreen, a voice recognition module, and the like. In addition, the input unit 2020 may also include a finger mouse device or a mouse operating using a trackball, a laser pointer, or the like. The input unit 2020 may further include various sensor modules by which users may input data.

The output unit 2030 may output information processed in the electronic device 2000 in a form of audio or video, and the memory 2040 may store a program, data, or the like, to process and control the processor 2050. The memory 2040 may include one or more semiconductor devices 100, 200, and 300 according to various example embodiments of inventive concepts, and the processor 2050 may store as well as output data by sending a command to the memory 2040 according to required operations. The processor 2050 may also be implemented by the semiconductor devices 100, 200, and 300 according to example embodiments described above.

The memory 2040 may communicate with the processor 2050 through an interface embedded in the electronic device 2000 or a separate interface. When the memory 2040 communicates with the processor 2050 through a separate interface, the processor 2050 may store or output data in or from the memory 2040 through various interface standards, such as SD, SDHC, SDXC, MICRO SD, USB, and the like.

The processor 2050 may control operations of respective units included in the electronic device 2000. The processor 2050 may perform control and process operations relating to voice calls, video calls, data communications, and the like, or may perform control and process operations to play and manage multimedia. In addition, the processor 2050 may process inputs sent by a user through the input unit 2020 and may output the results through the output unit 2030. Furthermore, the processor 2050 may store data required to control operations of the electronic device 2000 in the memory 2040 or output the data therefrom.

While example embodiments have been shown and described above, it will be apparent to those skilled in the art that modifications and variations could be made without departing from the scope as defined by the appended claims.

What is claimed is:

1. A semiconductor device, comprising:
a substrate having a protruding portion protruding in a direction perpendicular to an upper surface of the substrate;
source/drain regions in the protruding portion of the substrate;
a plurality of nanosheets between the source/drain regions, the plurality of nanosheets separated from each other in the direction perpendicular to the upper surface of the substrate, and the plurality of nanosheets defining channel regions that extend in a first direction;
a gate electrode surrounding the plurality of nanosheets, the gate electrode extending in a second direction intersecting the first direction, the gate electrode including a length in the first direction that is greater than a space between adjacent nanosheets among the plurality of nanosheets; and
a gate insulating layer between the plurality of nanosheets and the gate electrode.

2. The semiconductor device of claim 1, further comprising:
a substrate insulating layer surrounding the protruding portion on the substrate.

3. The semiconductor device of claim 2, wherein an upper surface of the substrate insulating layer and the upper surface of the protruding portion are co-planar.

4. The semiconductor device of claim 1, wherein the source/drain regions comprise an epitaxial layer.

5. The semiconductor device of claim 1, wherein a thickness of each of the plurality of nanosheets is less than or equal to about 0.8 times the space between the adjacent nanosheets.

6. The semiconductor device of claim 1, wherein at least one of the plurality of nanosheets contacts with the upper surface of the protruding portion.

7. A semiconductor device, comprising:
a substrate;
source/drain regions on the substrate, the source/drain regions extending a greater amount in a direction perpendicular to an upper surface of the substrate compared to a direction parallel to the upper surface of the substrate;
a plurality of nanosheets between the source/drain regions, the plurality of nanosheets defining channel regions that extend in a first direction, and the plurality of nanosheets including a first nanosheet and a second nanosheet separated from each other in the direction perpendicular to the upper surface of the substrate;
a gate electrode surrounding the plurality of nanosheets, the gate electrode extending in a second direction intersecting the first direction, the gate electrode including a length in the first direction that is greater than a space between adjacent nanosheets among the plurality of nanosheets; and
a gate insulating layer between the plurality of nanosheets and the gate electrode,
wherein the first nanosheet passes through the gate electrode, and
the second nanosheet contacts with at least a portion of the upper surface of the substrate between the gate electrode and the substrate.

8. The semiconductor device of claim 7, wherein a lower surface of the second nanosheet contacts with at least a portion of the upper surface of the substrate, and an upper surface of the second nanosheet contacts with the gate insulating layer.

9. The semiconductor device of claim 7, wherein
the substrate includes a protruding portion protruding in a direction perpendicular to the upper surface of the substrate, and
a lower surface of the second nanosheet contacts with an upper surface of the protruding portion.

10. The semiconductor device of claim 9, further comprising: a substrate insulating layer surrounding the protruding portion on the substrate.

11. The semiconductor device of claim 10, wherein a lower surface of the second nanosheet and an upper surface of the substrate insulating layer are co-planar.

12. A semiconductor device, comprising:
a substrate;
source/drain regions on the substrate, the source/drain regions extending in a direction perpendicular to an upper surface of the substrate;
a plurality of nanosheets between the source/drain regions, the plurality of nanosheets defining channel regions that extend in a first direction parallel to the upper surface of the substrate, and the plurality of nanosheets including a first nanosheet and a second nanosheet separated from each other in the direction perpendicular to the upper surface of the substrate;
a plurality of gate electrodes surrounding the plurality of nanosheets, the plurality of gate electrodes extending in a second direction parallel to the upper surface of the substrate and intersecting the first direction, and the plurality of gate electrodes include a first gate electrode and a second gate electrode; and
a plurality of gate insulating layers between the plurality of nanosheets and the plurality of gate electrodes,
wherein each of the plurality of gate electrodes include a length in the first direction that is greater than a space between adjacent nanosheets among the plurality of nanosheets,
the first gate electrode has a different structure from the second gate electrode, and
each of the first gate electrode and the second gate electrode includes a first region between the plurality of nanosheets and a second region surrounding the first region and having a different structure from the first region.

13. The semiconductor device of claim 12, wherein a number of metal layers included in the first gate electrode is different from a number of metal layers included in the second gate electrode.

\* \* \* \* \*